United States Patent
Kaneko et al.

(12)

(10) Patent No.: US 10,847,353 B2
(45) Date of Patent: Nov. 24, 2020

(54) PULSE MONITOR DEVICE AND PLASMA PROCESSING APPARATUS

(71) Applicant: TOKYO ELECTRON LIMITED, Tokyo (JP)

(72) Inventors: Kazushi Kaneko, Miyagi (JP); Yukinori Hanada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 204 days.

(21) Appl. No.: 16/182,708

(22) Filed: Nov. 7, 2018

(65) Prior Publication Data

US 2019/0148112 A1 May 16, 2019

(30) Foreign Application Priority Data

Nov. 10, 2017 (JP) ................. 2017-217463

(51) Int. Cl.
| | |
|---|---|
| *H01J 7/24* | (2006.01) |
| *H05B 31/26* | (2006.01) |
| *H01J 37/32* | (2006.01) |
| *G01R 23/02* | (2006.01) |

(52) U.S. Cl.
CPC .......... *H01J 37/3299* (2013.01); *G01R 23/02* (2013.01); *H01J 37/32229* (2013.01); *H01J 37/32311* (2013.01)

(58) Field of Classification Search
None
See application file for complete search history.

(56) References Cited

U.S. PATENT DOCUMENTS

| | | | | |
|---|---|---|---|---|
| 5,587,205 A | * | 12/1996 | Saito ..................... | C23C 16/511 |
| | | | | 118/723 MA |
| 2009/0105980 A1 | * | 4/2009 | Tetsuka ............. | H01J 37/32935 |
| | | | | 702/76 |
| 2015/0194292 A1 | * | 7/2015 | Kaneko ............. | H01J 37/32192 |
| | | | | 156/345.28 |

FOREIGN PATENT DOCUMENTS

| | | |
|---|---|---|
| JP | H06-267900 A | 9/1994 |
| JP | 2012-109080 A | 6/2012 |
| JP | 5320260 B2 | 10/2013 |

* cited by examiner

*Primary Examiner* — Anh Q Tran
(74) *Attorney, Agent, or Firm* — Studebaker & Brackett PC

(57) ABSTRACT

A device monitors a pulse frequency and a duty ratio of a microwave generated by a microwave output device provided in a plasma processing apparatus. The plasma processing apparatus includes a chamber main body, the microwave output device, a wave guide tube, and a tuner. The microwave output device generates the microwave of which power is pulse-modulated. The device includes a wave detection unit and an acquisition unit. The wave detection unit detects a measured value corresponding to travelling wave power of a microwave in the wave guide tube. The acquisition unit acquires a frequency and a duty ratio of the travelling wave power on the basis of the measured value detected by the wave detection unit.

20 Claims, 24 Drawing Sheets

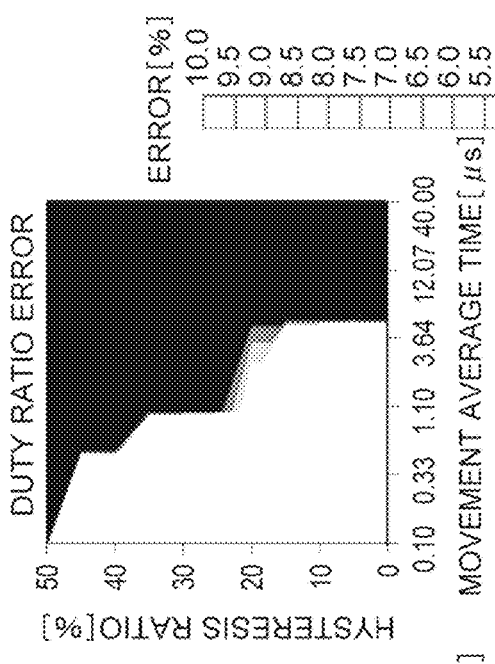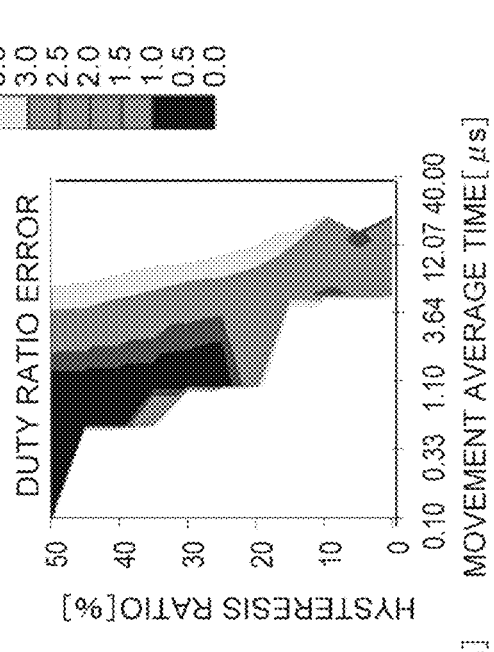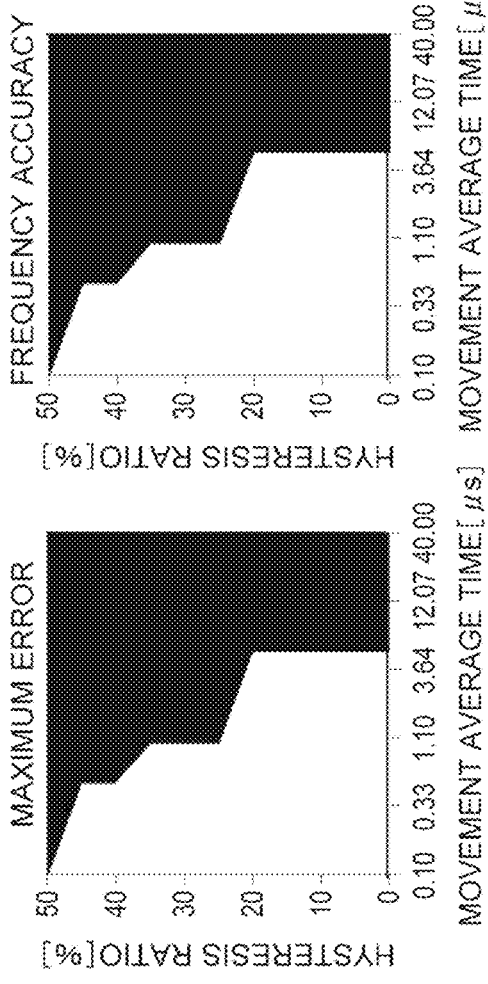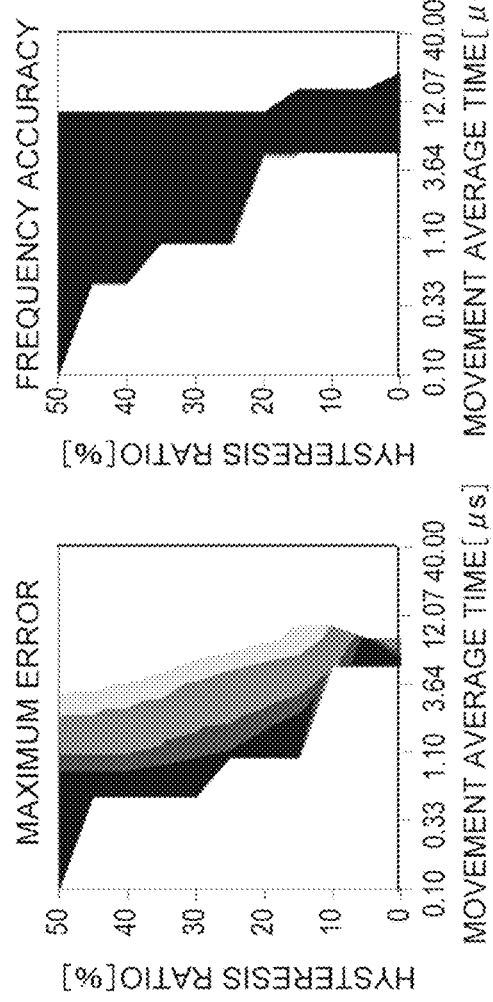
Fig.20A Fig.20B Fig.20C Fig.20D Fig.20E Fig.20F

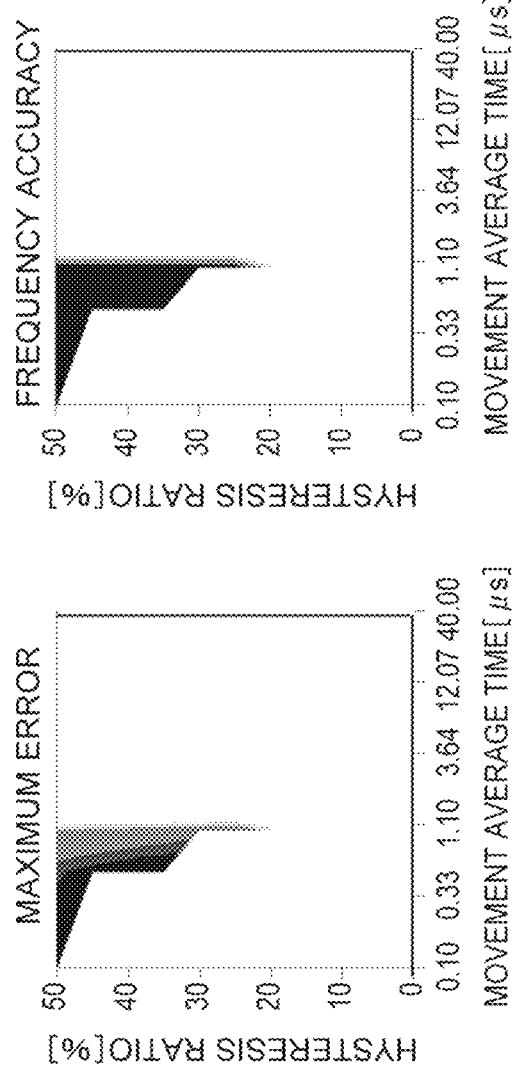

PULSE MONITOR DEVICE AND PLASMA PROCESSING APPARATUS

CROSS-REFERENCE TO RELATED APPLICATIONS

This application is based on and claims the benefit of priority from Japanese Patent Application No. 2017-217463 filed on Nov. 10, 2017, and the entire contents of which are incorporated herein by reference.

TECHNICAL FIELD

Exemplary embodiments of the present disclosure relate to a pulse monitor device and a plasma processing apparatus.

BACKGROUND

A plasma processing apparatus is used to manufacture an electronic device such as a semiconductor device. The plasma processing apparatus includes various types of apparatuses such as a capacitive coupling type plasma processing apparatus and an inductive coupling type plasma processing apparatus. In recent years, a plasma processing apparatus of a type of exciting a gas by using microwaves has been used.

Japanese Unexamined Patent Publication No. 2012-109080 discloses a plasma processing apparatus using microwaves. The plasma processing apparatus includes a microwave output device outputting a microwave having a bandwidth. The apparatus can stabilize plasma by outputting the microwave having a bandwidth.

Japanese Unexamined Patent Publication No. H6-267900 discloses an apparatus which pulse-modulates a microwave for exciting plasma. This apparatus can prevent instability of plasma so as to reduce an electron temperature and an ion temperature.

SUMMARY

In an aspect, there is provided a pulse monitor device. The pulse monitor device monitors a pulse frequency and a duty ratio of a microwave generated by a microwave output device provided in a plasma processing apparatus. The plasma processing apparatus includes a chamber main body, the microwave output device, a wave guide tube, and a tuner. The microwave output device generates a microwave which has a center frequency and a bandwidth respectively corresponding to a setting frequency and a setting bandwidth for which instructions are given from a controller and of which power is pulse-modulated such that a pulse frequency, a duty ratio, a high level, and a low level respectively corresponding to a setting pulse frequency, a setting duty ratio, high level setting power, and low level setting power for which instructions are given from the controller are obtained. The wave guide tube that is connected between the microwave output device and the chamber main body. The tuner is provided in the wave guide tube. The pulse monitor device includes a wave detection unit and an acquisition unit. The wave detection unit detects a measured value corresponding to travelling wave power of a microwave in the wave guide tube. The acquisition unit acquires a frequency and a duty ratio of the travelling wave power on the basis of the measured value detected by the wave detection unit.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 20A to 20F are graphs illustrating results of simulating a relationship among a hysteresis ratio, a movement average time, and the maximum error every pulse frequency (1 kHz and 10 kHz).

FIGS. 22A to 22C are graphs illustrating results of simulating a relationship among a hysteresis ratio, a movement average time, and the maximum error at a pulse frequency (50 kHz).

DETAILED DESCRIPTION

Figure 1:
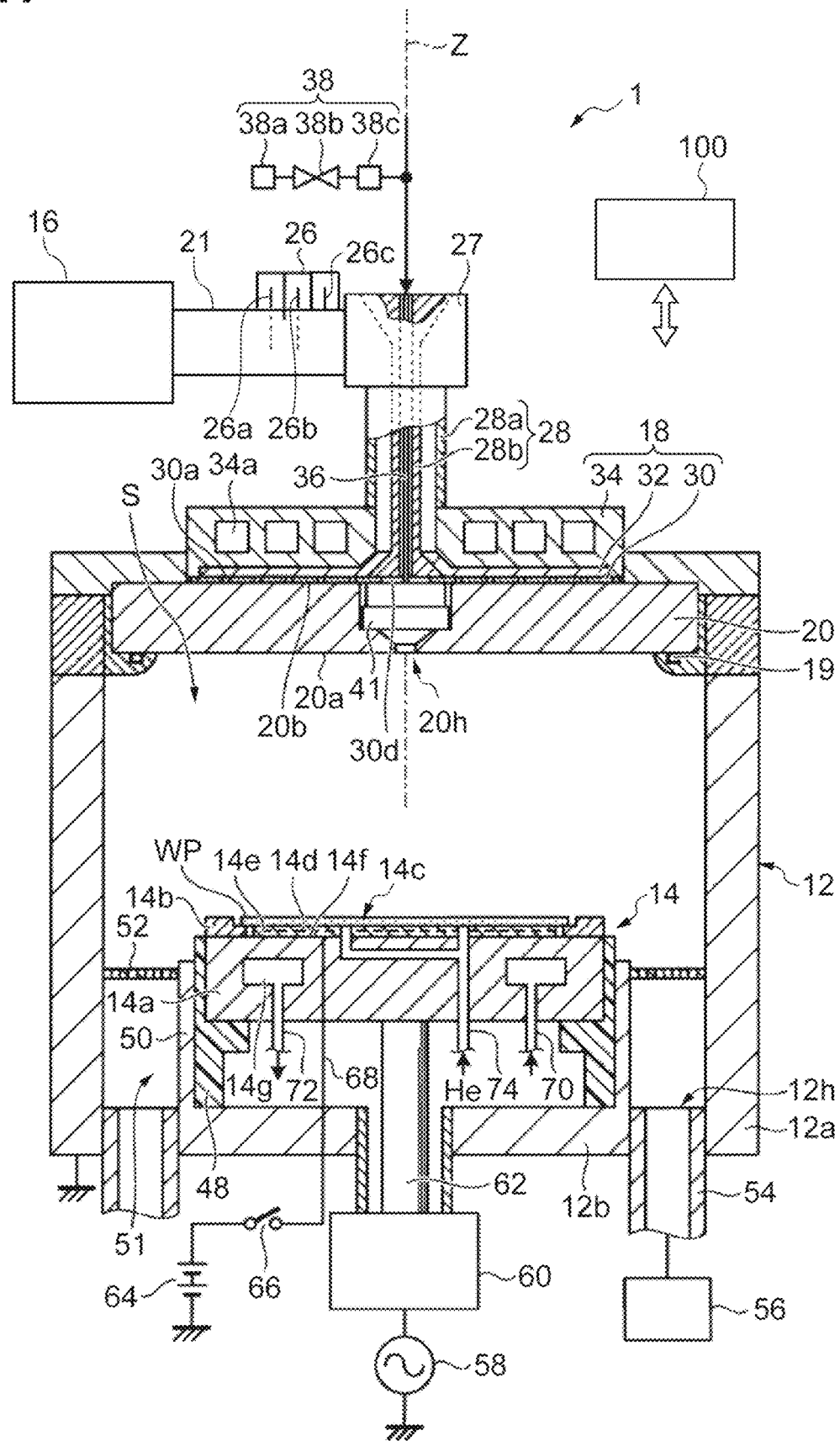
FIG. 1 is a diagram illustrating an example of a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In an electronic device manufacturing field, achievement of low power of a microwave progresses in order to further reduce damage to an object to be processed. However, if power of a microwave is too low, there is concern that plasma may become unstable or a misfire may occur. In other words, there is a limitation in an approach to achievement of low power. As a separate approach, an electron temperature of plasma may be further reduced.

In order to stabilize plasma and also to reduce an electron temperature, power of a microwave may be pulse-modulated as in the apparatus disclosed in Japanese Unexamined Patent Publication No. H6-267900 by employing a microwave having a bandwidth as in the apparatus disclosed in Japanese Unexamined Patent Publication No. 2012-109080. In such pulse modulation, it is necessary to check that power of a travelling wave output from the microwave output device is pulse-modulated.

In this technical field, there is the need for a pulse monitor device and a plasma processing apparatus which can monitor a pulse frequency and a duty ratio of a microwave which is input to a processing container in a case where power of the microwave having a bandwidth is pulse-modulated.

In a first aspect, there is provided a pulse monitor device. The pulse monitor device monitors a pulse frequency and a duty ratio of a microwave generated by a microwave output device provided in a plasma processing apparatus. The plasma processing apparatus includes a chamber main body, the microwave output device, a wave guide tube, and a tuner. The microwave output device generates a microwave which has a center frequency and a bandwidth respectively corresponding to a setting frequency and a setting bandwidth for which instructions are given from a controller and of which power is pulse-modulated such that a pulse frequency, a duty ratio, a high level, and a low level respectively corresponding to a setting pulse frequency, a setting duty ratio, high level setting power, and low level setting power for which instructions are given from the controller are obtained. The wave guide tube that is connected between the microwave output device and the chamber main body. The tuner is provided in the wave guide tube. The pulse monitor device includes a wave detection unit and an acquisition unit. The wave detection unit detects a measured value corresponding to travelling wave power of a microwave in the wave guide tube. The acquisition unit acquires a frequency and a duty ratio of the travelling wave power on the basis of the measured value detected by the wave detection unit.

In the pulse monitor device, a measured value corresponding to travelling wave power of a microwave in the wave guide tube is detected by the wave detection unit, and a frequency and a duty ratio of the travelling wave power are acquired by the acquisition unit. Thus, the pulse monitor device can monitor a pulse frequency and a duty ratio of a microwave which is input to a processing container in a case where power of the microwave having a bandwidth is pulse-modulated.

In an exemplary embodiment, in a case where hysteresis threshold values for determining a high level and a low level of travelling wave power of a microwave detected by the wave detection unit are defined according to Equation (1), the acquisition unit may acquire a frequency and a duty ratio of the travelling wave power of the microwave by using a hysteresis ratio and a movement average time included in a first region on a coordinate plane in which a longitudinal axis expresses a hysteresis ratio, and a transverse axis expresses a movement average time. The first region may be a closed region obtained by connecting, with line segments, a first point at which the hysteresis ratio is 50% and the movement average time is 0.1 μs, a second point at which the hysteresis ratio is 45% and the movement average time is 0.5 μs, a third point at which the hysteresis ratio is 40% and the movement average time is 0.5 μs, a fourth point at which the hysteresis ratio is 37% and the movement average time is 0.75 μs, and a fifth point at which the hysteresis ratio is 50% and the movement average time is 0.6 μs to each other in an order of the first point, the second point, the third point, the fourth point, and the fifth point, and the first point.

$$\begin{cases} HysH = \dfrac{Pset}{2} + Pset \cdot Hys \cdot \dfrac{1}{100} \\ HysL = \dfrac{Pset}{2} - Pset \cdot Hys \cdot \dfrac{1}{100} \end{cases} \quad (1)$$

Here, HysH indicates a threshold value for determining a high level of travelling wave power of a microwave, HysL indicates a threshold value for determining a low level of travelling wave power of a microwave, Pset indicates high level setting power, and Hys indicates the hysteresis ratio and is 0% or more and 50% or less.

In the pulse monitor device, in a case where hysteresis threshold values are defined according to Equation (1), a frequency and a duty ratio of travelling wave power of a microwave are acquired by using a hysteresis ratio and a movement average time included in the first region. In a case where the hysteresis ratio and the movement average time satisfy the condition, the pulse monitor device can make each of an error of a detection pulse frequency with respect to a setting pulse frequency and an error of a detection duty ratio with respect to a setting duty ratio 1% or less. Therefore, the pulse monitor device can highly accurately monitor a pulse frequency and a duty ratio of a microwave which is input to a processing container.

In an exemplary embodiment, the pulse monitor device may use a second region instead of the first region. The second region may be a closed region obtained by connecting, with line segments, a first point at which the hysteresis ratio is 50% and the movement average time is 0.1 μs, a second point at which the hysteresis ratio is 45% and the movement average time is 0.5 μs, a third point at which the hysteresis ratio is 40% and the movement average time is 0.5 μs, a sixth point at which the hysteresis ratio is 35% and the movement average time is 1.0 μs, and a seventh point at which the hysteresis ratio is 50% and the movement average time is 1.0 μs to each other in an order of the first point, the second point, the third point, the sixth point, and the seventh point, and the first point. In this case, the pulse monitor device can make each of an error of a detection pulse frequency with respect to a setting pulse frequency and an error of a detection duty ratio with respect to a setting duty ratio 3% or less.

In an exemplary embodiment, the low level setting power is 0 W or more and 400 W or less. In other words, a set pulse may be an ON/OFF pulse which is 0 W other than the time at which the pulse is in an ON state, and may be a high/low pulse to the extent to which plasma excitation does not occur in a low level.

In an exemplary embodiment, the wave detection unit may detect a measured value corresponding to travelling wave power of a microwave in a wave guide tube between the microwave output device and the tuner. In this case, the pulse monitor device can monitor travelling wave power of a microwave on a primary side of the tuner.

In an exemplary embodiment, the wave detection unit may detect a measured value corresponding to travelling wave power of a microwave on the basis of a wave detection signal in the tuner. In this case, the pulse monitor device can monitor travelling wave power of a microwave by using a detection signal in the tuner.

In an exemplary embodiment, the wave detection unit may detect a measured value corresponding to travelling wave power of a microwave in a wave guide tube between the tuner and the chamber main body. In this case, the pulse monitor device can monitor travelling wave power of a microwave on a secondary side of the tuner.

In an exemplary embodiment, the pulse monitor device may further include a warning unit that compares a pulse frequency or a duty ratio measured by the wave detection unit with a predetermined threshold value, and outputs a warning on the basis of a comparison result. In this case, the pulse monitor device can detect that a microwave is not output as set.

In a second aspect, there is provided a plasma processing apparatus including the above-described pulse monitor device.

According to various aspects and exemplary embodiments of the present disclosure, it is possible to provide a pulse monitor device and a plasma processing apparatus which can monitor a pulse frequency and a duty ratio of a microwave which is input to a processing container in a case where power of the microwave having a bandwidth is pulse-modulated.

Hereinafter, various exemplary embodiments will be described in detail with reference to the drawings. In the drawings, the same reference numeral will be given to the same portion or an equivalent portion in the drawings.

First Exemplary Embodiment

Plasma Processing Apparatus

FIG. 1 is a diagram illustrating a plasma processing apparatus according to an exemplary embodiment. As illustrated in FIG. 1, a plasma processing apparatus 1 includes a chamber main body 12 and a microwave output device 16. The plasma processing apparatus 1 may further include a stage 14, an antenna 18, and a dielectric window 20.

The chamber main body 12 provides a processing space S at the inside thereof. The chamber main body 12 includes a side wall 12a and a bottom portion 12b. The side wall 12a is formed in an approximately cylindrical shape. A central axial line of the side wall 12a approximately matches an axial line Z which extends in a vertical direction. The bottom portion 12b is provided on a lower end side of the side wall 12a. An exhaust hole 12h for exhaust is provided in the bottom portion 12b. An upper end of the side wall 12a is an opening.

The dielectric window 20 is provided over the upper end of the side wall 12a. The dielectric window 20 includes a lower surface 20a which faces the processing space S. The dielectric window 20 closes the opening in the upper end of the side wall 12a. An O-ring 19 is interposed between the dielectric window 20 and the upper end of the side wall 12a. The chamber main body 12 is more reliably sealed due to the O-ring 19.

The stage 14 is accommodated in the processing space S. The stage 14 is provided to face the dielectric window 20 in the vertical direction. The stage 14 is provided such that the processing space S is provided between the dielectric window 20 and the stage 14. The stage 14 is configured to support a workpiece WP (for example, a wafer) which is mounted thereon.

In an exemplary embodiment, the stage 14 includes a base 14a and an electrostatic chuck 14c. The base 14a has an approximately disc shape, and is formed from a conductive material such as aluminum. A central axial line of the base 14a approximately matches the axial line Z. The base 14a is supported by a cylindrical support 48. The cylindrical support 48 is formed from an insulating material, and extends from the bottom portion 12b in a vertically upward direction. A conductive cylindrical support 50 is provided on an outer circumference of the cylindrical support 48. The cylindrical support 50 extends from the bottom portion 12b of the chamber main body 12 along the outer circumference of the cylindrical support 48 in a vertically upward direction. An annular exhaust path 51 is formed between the cylindrical support 50 and the side wall 12a.

A baffle plate 52 is provided at an upper portion of the exhaust path 51. The baffle plate 52 has an annular shape. A plurality of through-holes, which pass through the baffle plate 52 in a plate thickness direction, are formed in the baffle plate 52. The above-described exhaust hole 12h is provided on a lower side of the baffle plate 52. An exhaust device 56 is connected to the exhaust hole 12h through an exhaust pipe 54. The exhaust device 56 includes an automatic pressure control valve (APC), and a vacuum pump such as a turbo-molecular pump. A pressure inside the processing space S may be reduced to a desired vacuum degree by the exhaust device 56.

The base 14a also functions as a radio frequency electrode. A radio frequency power supply 58 for radio frequency bias is electrically connected to the base 14a through a feeding rod 62 and a matching unit 60. The radio frequency power supply 58 outputs a constant frequency which is suitable to control ion energy which is inducted to the workpiece WP, for example, a radio frequency of 13.56 MHz with power which is set.

The radio frequency power supply 58 may have a pulse generator, and may pulse-modulate radio frequency power (RF power) which is then output to the base 14a. In this case, the radio frequency power supply 58 pulse-modulates the radio frequency power such that high level power and low level power are periodically repeated. The radio frequency power supply 58 performs pulse adjustment on the basis of a synchronization signal PSS-R generated by the pulse generator. The synchronization signal PSS-R is a signal for determining a cycle and a duty ratio of the radio frequency power. As an example of setting during pulse modulation, a pulse frequency is 10 Hz to 250 kHz, and a duty ratio of a pulse (a ratio of a high level power time to a pulse cycle) is 10% to 90%.

The matching unit 60 accommodates a matching device configured to attain matching between impedance on the radio frequency power supply 58 side, and impedance mainly on a load side such as an electrode, plasma, and the chamber main body 12. A blocking capacitor for self-bias generation is included in the matching device. In a case where radio frequency power is pulse-modulated, the matching unit 60 is operated to perform matching on the basis of the synchronization signal PSS-R.

The electrostatic chuck 14c is provided on an upper surface of the base 14a. The electrostatic chuck 14c holds the workpiece WP with an electrostatic suction force. The electrostatic chuck 14c includes an electrode 14d, an insulating film 14e, and an insulating film 14f, and has an approximately disc shape. A central axial line of the electrostatic chuck 14c approximately matches the axial line Z. The electrode 14d of the electrostatic chuck 14c is configured with a conductive film, and is provided between the insulating film 14e and the insulating film 14f. A DC power supply 64 is electrically connected to the electrode 14d through a switch 66 and a covered wire 68. The electrostatic chuck 14c can suction and hold the workpiece WP by a coulomb's force which is generated by a DC voltage applied from the DC power supply 64. A focus ring 14b is provided on the base 14a. The focus ring 14b is disposed to surround the workpiece WP and the electrostatic chuck 14c.

A coolant chamber 14g is provided at the inside of the base 14a. For example, the coolant chamber 14g is formed to extend around the axial line Z. A coolant is supplied into the coolant chamber 14g from a chiller unit through a pipe 70. The coolant, which is supplied into the coolant chamber 14g, returns to the chiller unit through a pipe 72. A temperature of the coolant is controlled by the chiller unit, and thus a temperature of the electrostatic chuck 14c and a temperature of the workpiece WP are controlled.

A gas supply line 74 is formed in the stage 14. The gas supply line 74 is provided to supply a heat transfer gas, for example, a He gas to a space between an upper surface of the electrostatic chuck 14c and a rear surface of the workpiece WP.

The microwave output device 16 outputs a microwave which excites a process gas which is supplied into the chamber main body 12. The microwave output device 16 is configured to variably adjust a frequency, power, and a bandwidth of the microwave. The microwave output device 16 may generate a microwave having a single frequency by setting, for example, a bandwidth of the microwave to substantially 0. The microwave output device 16 may generate a microwave having a bandwidth having a plurality of frequency components. Power levels of the plurality of frequency components may be the same as each other, and only a center frequency component in the bandwidth may have a power level higher than power levels of other frequency components. In an example, the microwave output device 16 may adjust the power of the microwave in a range of 0 W to 5000 W, may adjust the frequency or the center frequency of the microwave in a range of 2400 MHz to 2500 MHz, and may adjust the bandwidth of the microwave in a range of 0 MHz to 100 MHz. The microwave output device 16 may adjust a frequency pitch (carrier pitch) of the plurality of frequency components of the microwave in the bandwidth in a range of 0 to 25 kHz.

The microwave output device 16 may include a pulse generator, and may pulse-modulate and output power of a microwave. In this case, the microwave output device 16 pulse-modulates the microwave such that high level power and low level power are periodically repeated. The microwave output device 16 adjusts a pulse on the basis of a synchronization signal PSS-M generated by the pulse generator. The synchronization signal PSS-M is a signal for determining a cycle and a duty ratio of microwave power. As an example of setting during pulse modulation, a pulse frequency is 1 Hz to 50 kHz, and a duty ratio of a pulse (a ratio of a high level power time to a pulse cycle) is 10% to 90%. The microwave output device 16 may pulse-modulate microwave power to be synchronized with radio frequency power pulse-modulated, output from the radio frequency power supply 58.

The plasma processing apparatus 1 further includes a wave guide tube 21, a tuner 26, a mode converter 27, and a coaxial wave guide tube 28. An output unit of the microwave output device 16 is connected to one end of the wave guide tube 21. The other end of the wave guide tube 21 is connected to the mode converter 27. For example, the wave guide tube 21 is a rectangular wave guide tube. The tuner 26 is provided in the wave guide tube 21. The tuner 26 has stubs 26a, 26b, and 26c. Each of the stubs 26a, 26b, and 26c is configured to adjust a protrusion amount thereof with respect to an inner space of the wave guide tube 21. The tuner 26 adjusts a protrusion position of each of the stubs 26a, 26b, and 26c with respect to a reference position so as to match impedance of the microwave output device 16 with impedance of a load, for example, impedance of the chamber main body 12.

The mode converter 27 converts a mode of the microwave transmitted from the wave guide tube 21, and supplies the microwave having undergone mode conversion to the coaxial wave guide tube 28. The coaxial wave guide tube 28 includes an outer conductor 28a and an inner conductor 28b. The outer conductor 28a has an approximately cylindrical shape, and a central axial line thereof approximately matches the axial line Z. The inner conductor 28b has an approximately cylindrical shape, and extends on an inner side of the outer conductor 28a. A central axial line of the inner conductor 28b approximately matches the axial line Z. The coaxial wave guide tube 28 transmits the microwave from the mode converter 27 to the antenna 18.

The antenna 18 is provided on a surface 20b opposite to the lower surface 20a of the dielectric window 20. The antenna 18 includes a slot plate 30, a dielectric plate 32, and a cooling jacket 34.

The slot plate 30 is provided on a surface 20b of the dielectric window 20. The slot plate 30 is formed from a conductive metal, and has an approximately disc shape. A central axial line of the slot plate 30 approximately matches the axial line Z. A plurality of slot holes 30a are formed in the slot plate 30. In an example, the plurality of slot holes 30a constitute a plurality of slot pairs. Each of the plurality of slot pairs includes two slot holes 30a which extend in directions interesting each other and have an approximately elongated hole shape. The plurality of slot pairs are arranged along one or more concentric circles centering around the axial line Z. In addition, a through-hole 30d, through which a conduit 36 to be described later can pass, is formed in the central portion of the slot plate 30.

The dielectric plate 32 is formed on the slot plate 30. The dielectric plate 32 is formed from a dielectric material such as quartz, and has an approximately disc shape. A central axial line of the dielectric plate 32 approximately matches the axial line Z. The cooling jacket 34 is provided on the dielectric plate 32. The dielectric plate 32 is provided between the cooling jacket 34 and the slot plate 30.

A surface of the cooling jacket 34 has conductivity. A flow passage 34a is formed at the inside of the cooling jacket 34. A coolant is supplied to the flow passage 34a. A lower end of the outer conductor 28a is electrically connected to an upper surface of the cooling jacket 34. In addition, a lower end of the inner conductor 28b passes through a hole formed in a central portion of the cooling jacket 34 and the dielectric plate 32 and is electrically connected to the slot plate 30.

A microwave from the coaxial wave guide tube 28 propagates through the inside of the dielectric plate 32 and is supplied to the dielectric window 20 from the plurality of slot holes 30a of the slot plate 30. The microwave, which is supplied to the dielectric window 20, is introduced into the processing space S.

The conduit 36 passes through an inner hole of the inner conductor 28b of the coaxial wave guide tube 28. In addition, as described above, the through-hole 30d, through which the conduit 36 can pass, is formed at the central portion of the slot plate 30. The conduit 36 extends to pass through the inner hole of the inner conductor 28b, and is connected to a gas supply system 38.

The gas supply system 38 supplies a process gas for processing the workpiece WP to the conduit 36. The gas supply system 38 may include a gas source 38a, a valve 38b, and a flow rate controller 38c. The gas source 38a is a gas source of the process gas. The valve 38b switches supply and supply stoppage of the process gas from the gas source 38a. For example, the flow rate controller 38c is a mass flow controller, and adjusts a flow rate of the process gas from the gas source 38a.

The plasma processing apparatus 1 may further include an injector 41. The injector 41 supplies a gas from the conduit 36 to a through-hole 20h which is formed in the dielectric window 20. The gas, which is supplied to the through-hole 20h of the dielectric window 20, is supplied to the processing space S. In addition, the process gas is excited by a microwave which is introduced into the processing space S from the dielectric window 20. According to this, plasma is generated in the processing space S, and the workpiece WP is processed by active species such as ions and/or radicals from the plasma.

The plasma processing apparatus 1 further includes a controller 100. The controller 100 collectively controls respective units of the plasma processing apparatus 1. The controller 100 may include a processor such as a CPU, a user interface, and a storage unit.

The processor executes a program and a process recipe which are stored in the storage unit so as to collectively control respective units such as the microwave output device 16, the stage 14, the gas supply system 38, and the exhaust device 56.

The user interface includes a keyboard or a touch panel with which a process manager performs a command input operation and the like so as to manage the plasma processing apparatus 1, a display which visually displays an operation situation of the plasma processing apparatus 1 and the like.

The storage unit stores control programs (software) for realizing various kinds of processing executed by the plasma processing apparatus 1 by a control of the processor, a process recipe including process condition data and the like, and the like. The processor calls various kinds of control programs from the storage unit and executes the control programs in correspondence with necessity including an instruction from the user interface. Desired processing is executed in the plasma processing apparatus 1 under the control of the processor.

Configuration Example of Microwave Output Device 16

Figure 2:
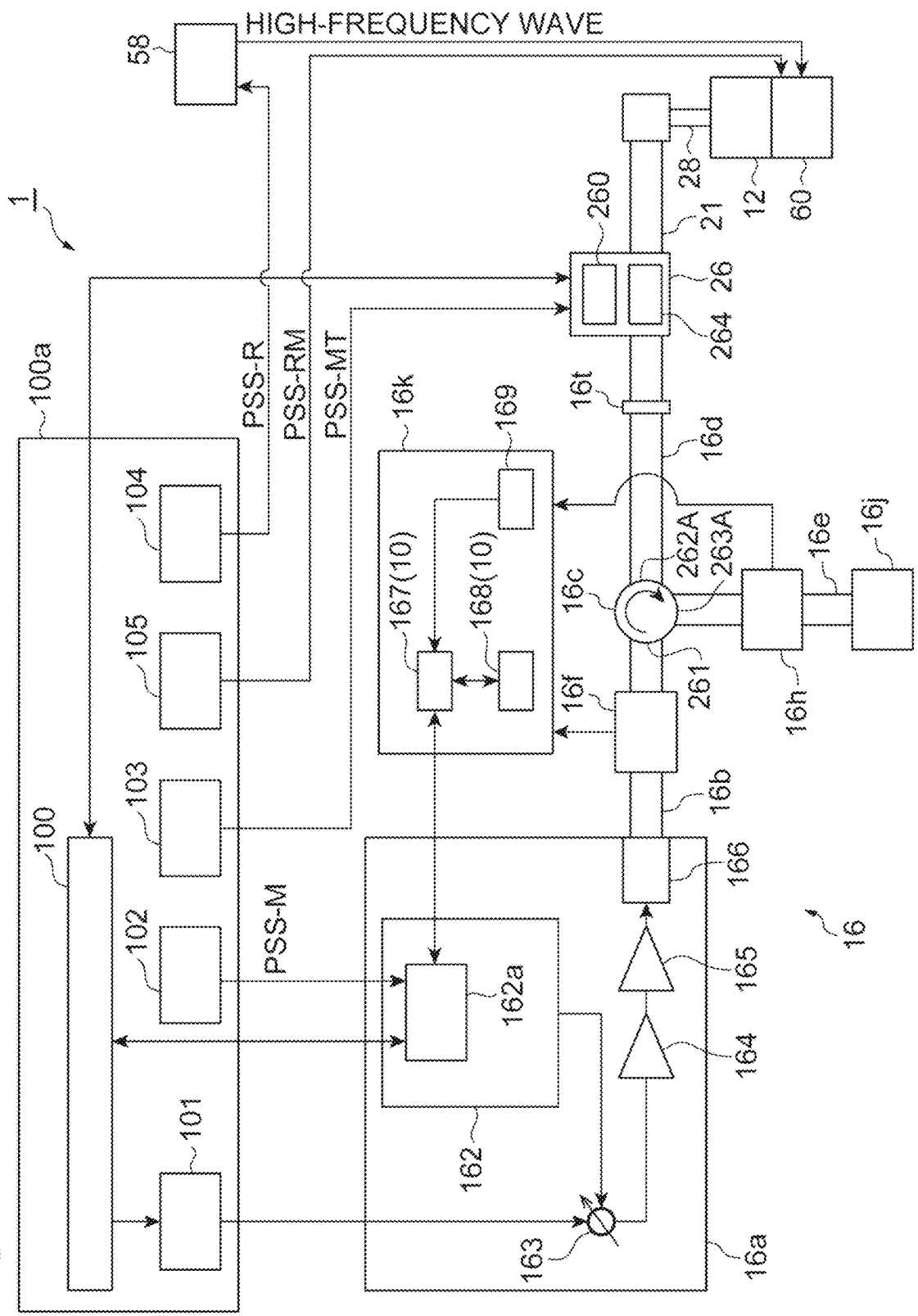
FIG. 2 is a diagram illustrating an example of a microwave output device.

FIG. 2 is a diagram illustrating an example of the microwave output device. As illustrated in FIG. 2, the microwave output device 16 is connected to a calculation device 100a. The calculation device 100a includes a controller 100, a waveform generator 101, a first pulse generator 102, a second pulse generator 103, a third pulse generator 104, and a fourth pulse generator 105.

The waveform generator 101 generates a waveform of a microwave. The waveform generator 101 generates a waveform of a microwave having a center frequency and a bandwidth respectively corresponding to a setting frequency and a setting bandwidth designated by the controller 100. The waveform generator 101 outputs the waveform of the microwave to the microwave output device 16.

The first pulse generator 102 generates a synchronization signal which is used to pulse-modulate microwave power in the microwave output device 16. The first pulse generator 102 generates a synchronization signal PSS-M on the basis of a setting pulse frequency and a setting duty ratio of microwave power in a setting profile which is set by the controller 100. The first pulse generator 102 outputs the synchronization signal PSS-M to the microwave output device 16.

The second pulse generator 103 generates a synchronization signal which is used to subject microwave power of which power is pulse-modulated to impedance matching in the tuner 26. In the same manner as the first pulse generator 102, the second pulse generator 103 generates a synchronization signal PSS-MT on the basis of a setting pulse frequency and a setting duty ratio of microwave power in a setting profile which is set by the controller 100. The synchronization signal PSS-MT has the same pulse frequency and duty ratio as those of the synchronization signal PSS-M. The second pulse generator 103 outputs the synchronization signal PSS-MT to the tuner 26.

The third pulse generator 104 generates a synchronization signal which is used to pulse-modulate radio frequency power in the radio frequency power supply 58. The third pulse generator 104 generates a synchronization signal PSS-R on the basis of a setting pulse frequency and a setting duty ratio of radio frequency power in a setting profile which is set by the controller 100. The third pulse generator 104 outputs the synchronization signal PSS-R to the radio frequency power supply 58.

The fourth pulse generator 105 generates a synchronization signal which is used to subject a radio frequency of which power is pulse-modulated to impedance matching in the matching unit 60. In the same manner as the third pulse generator 104, the fourth pulse generator 105 generates a synchronization signal PSS-RM on the basis of a setting pulse frequency and a setting duty ratio of radio frequency power in a setting profile which is set by the controller 100. The synchronization signal PSS-RM has the same pulse frequency and duty ratio as those of the synchronization signal PSS-R. The fourth pulse generator 105 outputs the synchronization signal PSS-RM to the matching unit 60.

The first pulse generator 102 may generate the synchronization signal PSS-M which is synchronized with the synchronization signal PSS-R. In this case, pulse-modulation of microwave power and pulse-modulation of radio frequency power can be synchronized with each other, and thus it is possible to stably generate plasma.

The microwave output device 16 pulse-modulates the waveform of the microwave generated by the waveform generator 101 according to the setting in the controller 100, and outputs the microwave. The microwave output device 16 includes a microwave generation unit 16a, a wave guide tube 16b, a circulator 16c, a wave guide tube 16d, a wave guide tube 16e, a first directional coupler 16f, a second directional coupler 16h, a measurement unit 16k (an example of a measurement unit), and a dummy load 16j.

The microwave generation unit 16a generates the microwave of which power is pulse-modulated so as to obtain a setting pulse frequency, a duty ratio, high level power, and low level power respectively corresponding to a pulse frequency, a setting duty ratio, high level setting power, and low level setting power for which instructions are given by the controller 100.

The microwave generation unit 16a includes a power control unit 162, an attenuator 163, an amplifier 164, an amplifier 165, and a mode converter 166.

The waveform generator 101 is connected to the attenuator 163. The attenuator 163 is a device which can changes an attenuation amount (attenuation rate) according to an applied voltage value as an example. The attenuator 163 is connected to the power control unit 162. The power control unit 162 controls an attenuation rate (attenuation amount) of a microwave in the attenuator 163 by using an applied voltage value. The power control unit 162 controls an attenuation rate (attenuation amount) of a microwave in the attenuator 163 such that a microwave output from the waveform generator 101 becomes a microwave having power corresponding to a setting pulse frequency, a setting duty ratio, high level setting power, and low level setting power for which instructions are given by the controller 100.

The power control unit 162 includes the control unit 162a as an example. The control unit 162a may be a processor. The control unit 162a acquires a setting profile from the controller 100. The control unit 162a acquires the synchronization signal PSS-M from the first pulse generator 102. The control unit 162a determines an attenuation rate (attenuation amount) of a microwave on the basis of the synchronization signal PSS-M, and the setting profile which is set by the controller 100.

An output of the attenuator 163 is connected to the mode converter 166 via the amplifier 164 and the amplifier 165. Each of the amplifier 164 and the amplifier 165 amplifies a microwave at a predetermined amplification rate. The mode converter 166 converts a propagation mode of a microwave output from the amplifier 165 from TEM into TE01. A microwave, which is generated through the mode conversion in the mode converter 166, is output as an output microwave of the microwave generation unit 16a.

An output of the microwave generation unit 16a is connected to one end of the wave guide tube 16b. The other end of the wave guide tube 16b is connected to a first port 261 of the circulator 16c. The circulator 16c includes a first port 261, a second port 262A, and a third port 263A. The circulator 16c outputs a microwave, which is input to the first port 261, from the second port 262A, and outputs a microwave, which is input to the second port 262A, from the third port 263A. One end of the wave guide tube 16d is connected to the second port 262A of the circulator 16c. The other end of the wave guide tube 16d is an output unit 16t of the microwave output device 16.

One end of the wave guide tube 16e is connected to the third port 263A of the circulator 16c. The other end of the wave guide tube 16e is connected to the dummy load 16j. The dummy load 16j receives a microwave which propagates through the wave guide tube 16e and absorbs the microwave. For example, the dummy load 16j converts the microwave into heat.

The first directional coupler 16f is provided between one end and the other end of the wave guide tube 16b. The first directional coupler 16f is configured to branch parts of microwaves (that is, travelling waves) which are output from the microwave generation unit 16a and propagate to the output unit 16t, and to output the parts of the travelling waves.

The second directional coupler 16h is provided between one end and the other end of the wave guide tube 16e. The second directional coupler 16h is configured to branch parts of reflected waves transmitted to the third port 263A of the circulator 16c with respect to microwaves which return to the output unit 16t, and to output the parts of the reflected waves.

The measurement unit 16k is a device which measures a microwave in the wave guide tube. The measurement unit 16k includes a measurement control unit 167 (an example of an acquisition unit), a first wave detection unit 168 (an example of a wave detection unit), and a second wave detection unit 169.

The first wave detection unit 168 detects a measured value corresponding to travelling wave power of a microwave in the wave guide tube. The first wave detection unit 168 receives a travelling wave output from the first directional coupler 16f. The second wave detection unit 169 detects a measured value corresponding to reflected wave power of a microwave in the wave guide tube. The second wave detection unit 169 receives a reflected wave output from the second directional coupler 16h.

The measurement control unit 167 determines a first high measured value pf(H) and a first low measured value pf(L) respectively indicating a high level and a low level of power of a travelling wave at the output unit 16t on the basis of parts of travelling waves acquired by the first wave detection unit 168. The measurement control unit 167 determines a second high measured value pr(H) and a second low measured value pr(L) respectively indicating a high level and a low level of power of a reflected wave at the output unit 16t on the basis of parts of reflected waves acquired by the second wave detection unit 169.

The measurement control unit 167 acquires a frequency and a duty ratio of travelling wave power on the basis of a measured value detected by the first wave detection unit 168. A method of acquiring a frequency and a duty ratio of travelling wave power in the measurement control unit 167 will be described later.

The measurement unit 16k is connected to the power control unit 162. The measurement unit 16k outputs the measured values to the power control unit 162. The power control unit 162 controls the attenuator 163 such that a difference between the measured values of a travelling wave and a reflected wave, that is, load power (effective power) matches setting power designated by the controller 100 (power feedback control).

The pulse monitor device 10 according to the present exemplary embodiment is configured to include the measurement control unit 167 and the first wave detection unit 168. In other words, the pulse monitor device 10 branches and monitors a signal from the directional coupler used for the power feedback control. The pulse monitor device 10 is not necessarily used as a configuration for power feedback control, and may be added separately from the configuration for power feedback control.

The tuner 26 includes a tuner control unit 260 and a tuner wave detection unit 264. The tuner control unit 260 adjusts protrusion positions of the stubs 26a, 26b, and 26c such that impedance on the microwave output device 16 side matches impedance on the antenna 18 on the basis of a signal from the controller 100 and a detection result in the tuner wave detection unit 264. The tuner wave detection unit 264 is a three-probe wave detector as an example, and has probes with diodes. The tuner control unit 260 causes a driver circuit and an actuator (not illustrated) to operate the stubs 26a, 26b, and 26c.

The tuner control unit 260 acquires the synchronization signal PSS-MT for microwave power generated by the second pulse generator 103. The tuner control unit 260 operates the stubs 26a, 26b, and 26c on the basis of the synchronization signal. The radio frequency power supply 58 acquires the synchronization signal PSS-R for radio frequency power generated by the third pulse generator 104. The radio frequency power supply 58 pulse-modulates radio frequency power on the basis of the synchronization signal PSS-R. The matching unit 60 acquires the synchronization signal PSS-MT for radio frequency power generated by the fourth pulse generator 105. The matching unit 60 performs matching on pulse-modulated radio frequency power on the basis of the synchronization signal PSS-MT.

Details of Waveform Generator

Figure 3:
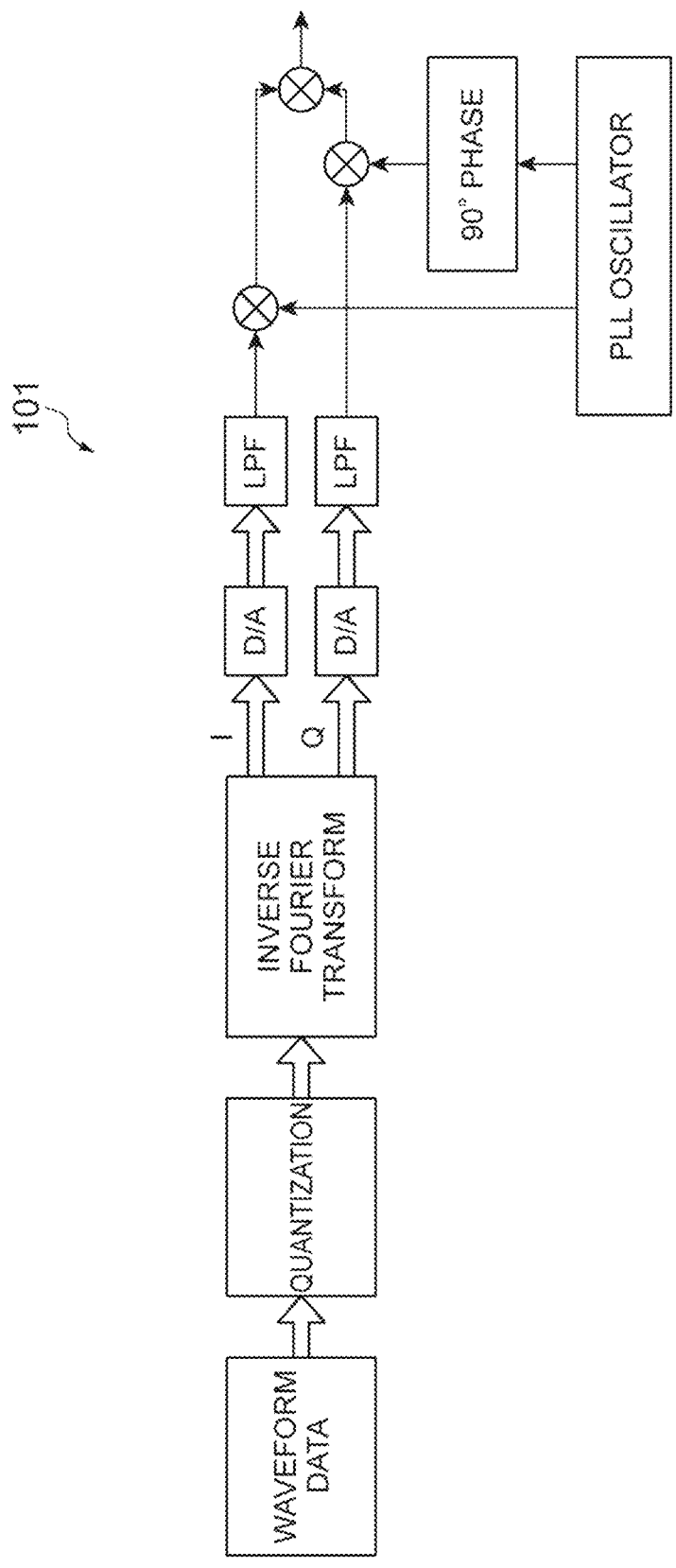
FIG. 3 is a diagram illustrating a microwave generation principle in a waveform generator.

FIG. 3 is a view illustrating a microwave generation principle in the waveform generator. As illustrated in FIG. 3, for example, the waveform generator 101 includes a phase locked loop (PLL) oscillator which can cause a microwave of which a phase is synchronized with that of a reference frequency to oscillate, and an IQ digital modulator which is connected to the PLL oscillator. The waveform generator 101 sets a frequency of a microwave which oscillates in the PLL oscillator to a setting frequency designated by the controller 100. The waveform generator 101 modulates a microwave from the PLL oscillator, and a microwave having a phase difference with the microwave from the PLL oscillator by 90° by using the IQ digital modulator. Consequently, the waveform generator 101 generates a microwave having a plurality of frequency components in a bandwidth or a microwave having a single frequency.

The waveform generator 101 may perform inverse discrete Fourier transform on, for example, N complex data symbols so as to generate a continuous signal and thus to generate a microwave having a plurality of frequency components. A method of generating such a signal may be a method such as an orthogonal frequency-division multiple access (OFDMA) modulation method used for digital TV broadcasting (for example, refer to Japanese Patent No. 5320260).

In an example, the waveform generator 101 has waveform data expressed by a digitalized code sequence in advance. The waveform generator 101 quantizes the waveform data, and applies the inverse Fourier transform to the quantized data so as to generate I data and Q data. The waveform generator 101 applies digital/analog (D/A) conversion to each of the I data and the Q data so as to obtain two analog signals. The waveform generator 101 inputs the analog signals to a low-pass filter (LPF) through which only a low frequency component passes. The waveform generator 101 mixes the two analog signals, which are output from the LPF, with a microwave from the PLL oscillator and a microwave having a phase difference with the microwave from the PLL oscillator by 90°, respectively. The waveform generator 101 combines microwaves which are generated through the mixing with each other. Consequently, the waveform generator 101 generates a frequency-modulated microwave having a single frequency component or a plurality of frequency components.

Example of Microwave

Figure 4:
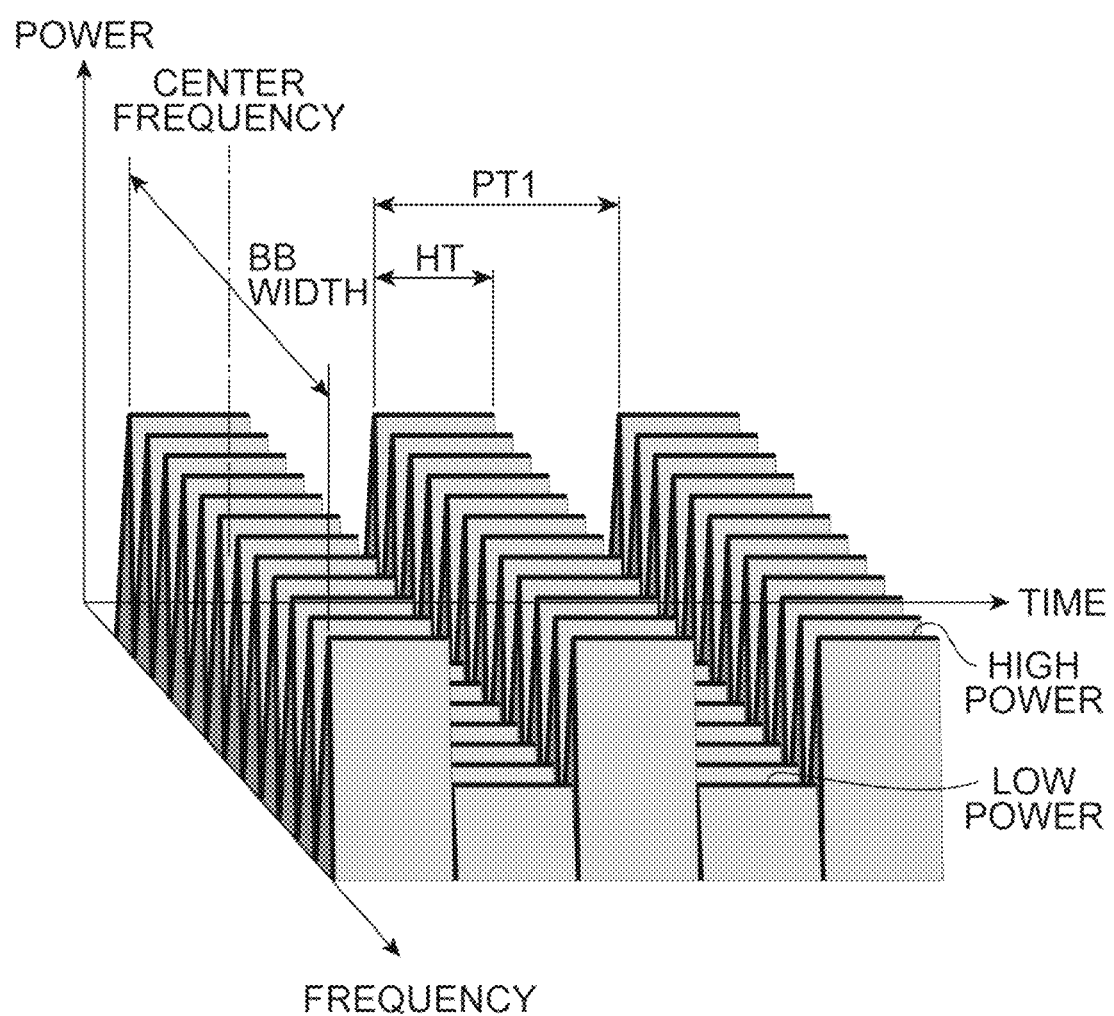
FIG. 4 is a diagram illustrating an example of a microwave of which power is pulse-modulated.

Microwave power output from the microwave generation unit 16a has a waveform modulated in a pulsed shape such that high level power and low level power are repeated. FIG. 4 illustrates an example of a microwave of which power is pulse-modulated. As illustrated in FIG. 4, a microwave has a center frequency and a bandwidth respectively corresponding to a setting frequency and a setting bandwidth for which instructions are given from the controller 100, and has a pulse frequency, a duty ratio, high level power, and low level power respectively corresponding to a setting pulse frequency, a setting duty ratio, high level setting power, and low level setting power for which instructions are given from the controller 100. The low level power is power lower than the high level power.

The low level power may be power lower than the lowest level required to maintain a plasma generation state. As an example, low level setting power may be 0 W or more and 400 W or less. In a case where the low level setting power is 0 W, microwave power is subjected to ON/OFF control. In a case where the low level setting power is 0 W, a value in which a noise level is taken into consideration may be set. In other words, ON/OFF control may include not only accurate repetition of 0 W and setting power but also a noise level. In a case where the low level setting power exceeds 0 W and 400 W or less, microwave power is subjected to high/low control to the extent to which plasma excitation does not occur in a low level. Hereinafter, a description will be made of an example in which the low level setting power is 0 W, but exemplary embodiments are not limited thereto.

Example of Microwave Synchronization Signal

Figure 5:
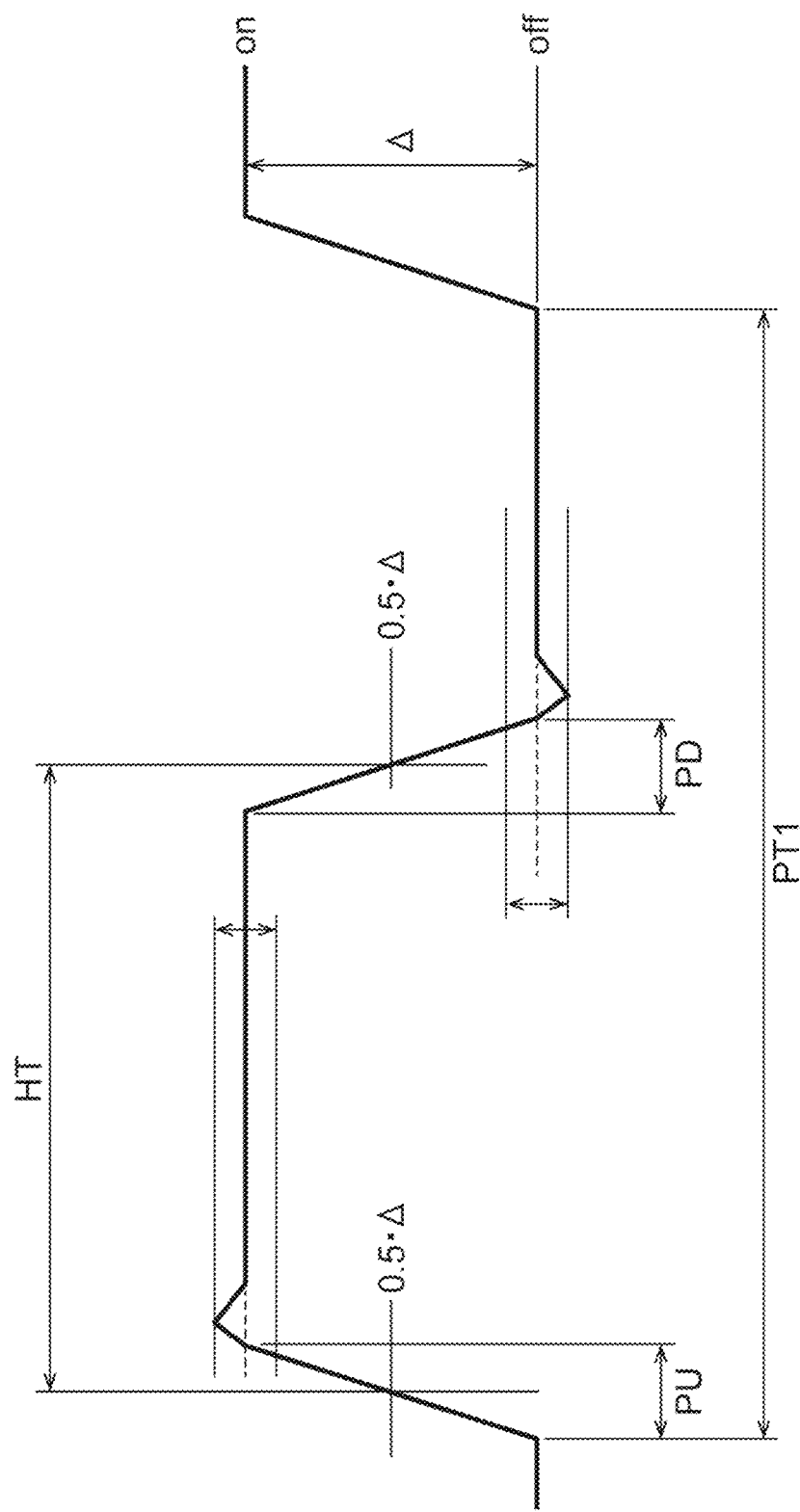
FIG. 5 is a diagram illustrating an example of a pulse-modulated microwave which is output in an analog form via a wave detector.

FIG. 5 illustrates an example of a pulse-modulated microwave which is output in an analog form via a wave detector. As illustrated in FIG. 5, the synchronization signal PSS-M is a pulse signal of which an ON state (high state) and an OFF state (low state) alternately appear. A pulse cycle PT1 of the synchronization signal PSS-M is defined by an interval between high level timings. If a difference between the high level and the low level is indicated by Δ, a high time HT is defined as a period from a timing at which the difference is 0.5Δ in a rising period PU of a pulse to a timing at which the difference is 0.5Δ in a falling period PD of the pulse. A ratio of the high time HT to the pulse cycle PT1 is the duty ratio. The first pulse generator 102 generates a synchronization signal as illustrated in FIG. 5 on the basis of the pulse frequency (1/PT1) and the duty ratio (HT/PT1× 100%) designated by the controller 100.

Example of Pulse Modulation of Microwave Power

Figure 6A:
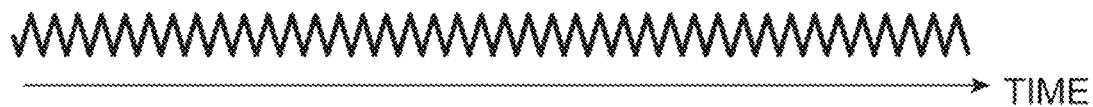
FIGS. 6A to 6C are diagrams for explaining a correspondence relationship among a microwave before being amplified, a synchronization signal, and a microwave after being modulated and amplified.
Figure 6B:
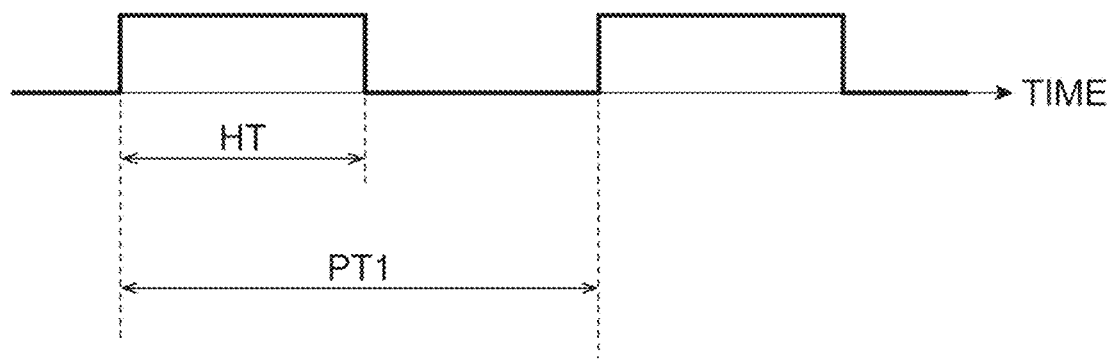
Figure 6C:
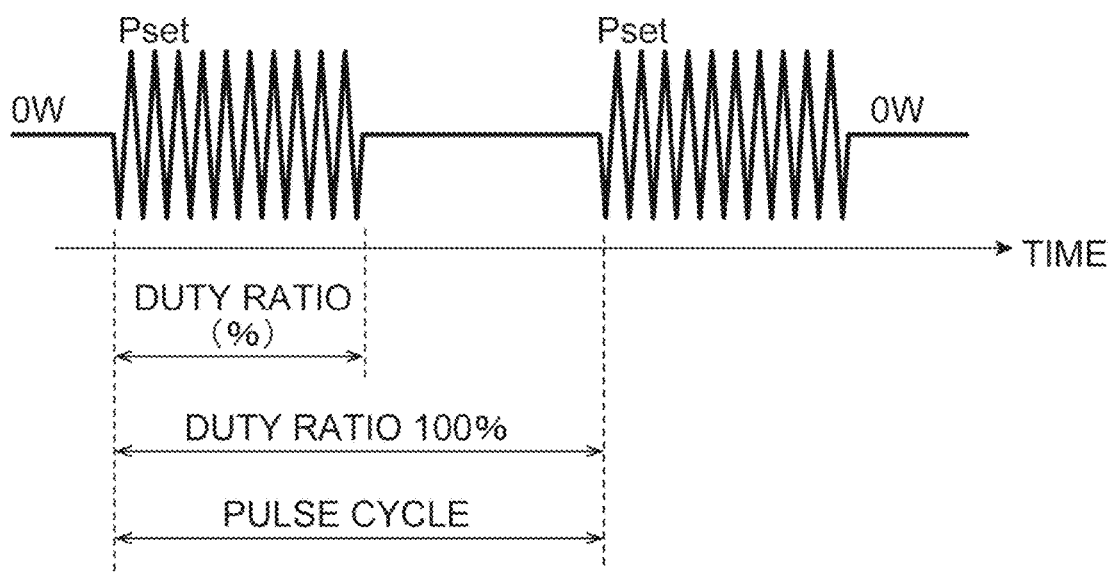

FIGS. 6A to 6C are diagrams for explaining a correspondence relationship among a microwave before being amplified, a synchronization signal, and a microwave after being modulated and amplified. A signal in FIG. 6A indicates a waveform of a microwave before being amplified, generated by the waveform generator 101. A signal in FIG. 6B indicates a waveform of the synchronization signal PSS-M generated by the first pulse generator 102. A signal in FIG. 6C indicates a waveform of a microwave which is modulated and amplified on the basis of the signals in FIG. 6A and FIG. 6B. A transverse axis in each drawing expresses time. The signal in FIG. 6A is attenuated on the basis of the signal in FIG. 6B by the power control unit 162 and the attenuator 163. For example, the signal in FIG. 6A is attenuated to 0 W other than the high time HT of the synchronization signal PSS-M. The attenuated signal is amplified by the amplifier 164 and the amplifier 165 so as to become the signal in FIG. 6C. The signal in FIG. 6C is amplified such that power in an ON state is setting power Pset. An ON state of the signal in FIG. 6C matches the high time HT of the synchronization signal PSS-M. A pulse cycle of the signal in FIG. 6C matches the pulse cycle PT1 of the synchronization signal PSS-M. In other words, a duty ratio (%) of microwave power matches the synchronization signal PSS-M.

Example of Data Sampling in Measurement Control Unit

Figure 7:
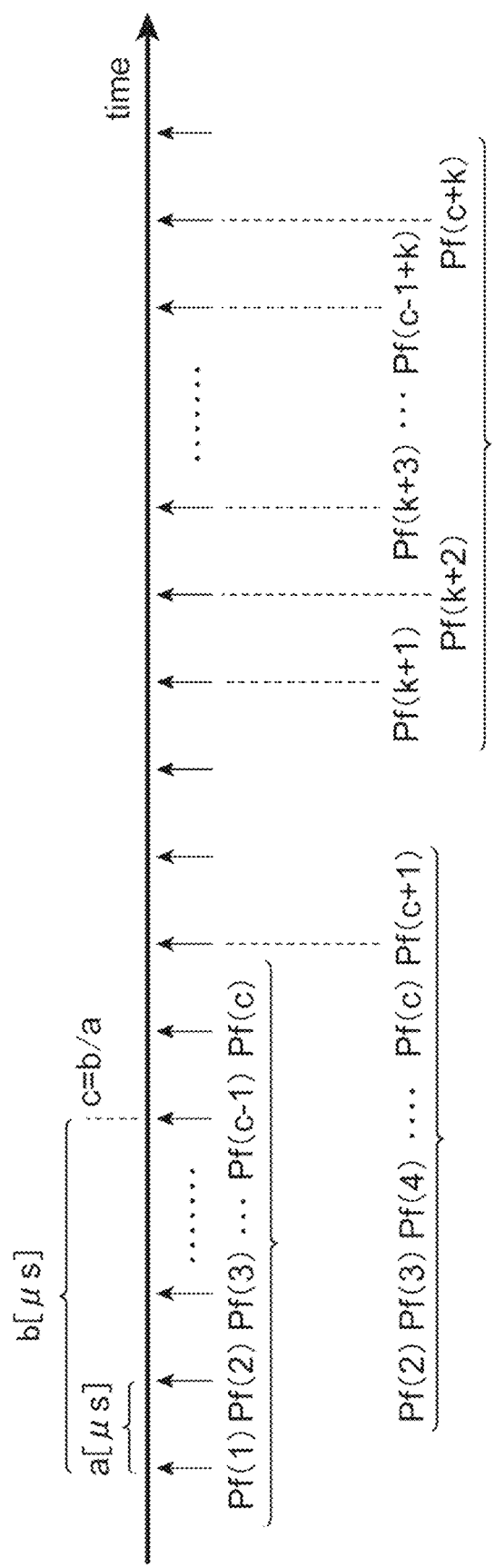
FIG. 7 is a diagram for explaining an example of a movement average.

The measurement control unit 167 may average data in order to accurately measure pulse-modulated travelling wave power. FIG. 7 is a diagram for explaining an example of a movement average. In FIG. 7, a indicates a sampling interval [μs], b indicates a movement average time [μs], and c indicates the number of samples. The sampling interval is 0.1 μs or less. The number of samples c is expressed by b/a. At a time point t=0, the measurement control unit 167 acquires and averages c samples from Pf(1) to Pf(c) at the sampling interval a. At a time point t=1, the measurement control unit 167 acquires and averages c samples from Pf(2) to Pf(c+1) at the sampling interval a. At a time point t=k, the measurement control unit 167 acquires and averages c samples from Pf(k+1) to Pf(c+k) at the sampling interval a. This is expressed by equations as follows.

$$Pf(t) = \frac{1}{c}\sum_{n=1}^{c} pf(n) \text{ at } t = 0$$

$$Pf(t) = \frac{1}{c}\sum_{n=1}^{c} pf(n+1) \text{ at } t = 1$$

$$\vdots$$

$$Pf(t) = \frac{1}{c}\sum_{n=1}^{c} pf(n+k) \text{ at } t = k$$

Consequently, a power waveform having different intensities is averaged. In the above example, an example of a travelling wave has been description, but a reflected wave may be averaged in the same method.

Example of ON/OFF Determination Travelling Wave Power in Measurement Control Unit The measurement control unit 167 may provide hysteresis in a threshold value for determining an ON state and a threshold value for determining an OFF state in order to accurately determine an ON state and an OFF state of pulse-modulated travelling wave power. In a case where a threshold value for determining a high level of travelling wave power of a microwave is indicated by HysH, a threshold value for determining a low level of travelling wave power of a microwave is indicated by HysL, high level setting power is indicated by Pset, and a hysteresis ratio (0% or more and 50% or less) is indicated by Hys, the hysteresis is expressed by the following Equation (1).

$$\begin{cases} HysH = \frac{Pset}{2} + Pset \cdot Hys \cdot \frac{1}{100} \\ HysL = \frac{Pset}{2} - Pset \cdot Hys \cdot \frac{1}{100} \end{cases} \quad (1)$$

The above equation is only anexl. For example, a hysteresis threshold value is not required to be the same interval as Pset/2. A high level threshold value HysH and a low level threshold value HysL may be separately set. The high level threshold value HysH may be more than the setting power Pset.

Figure 8:
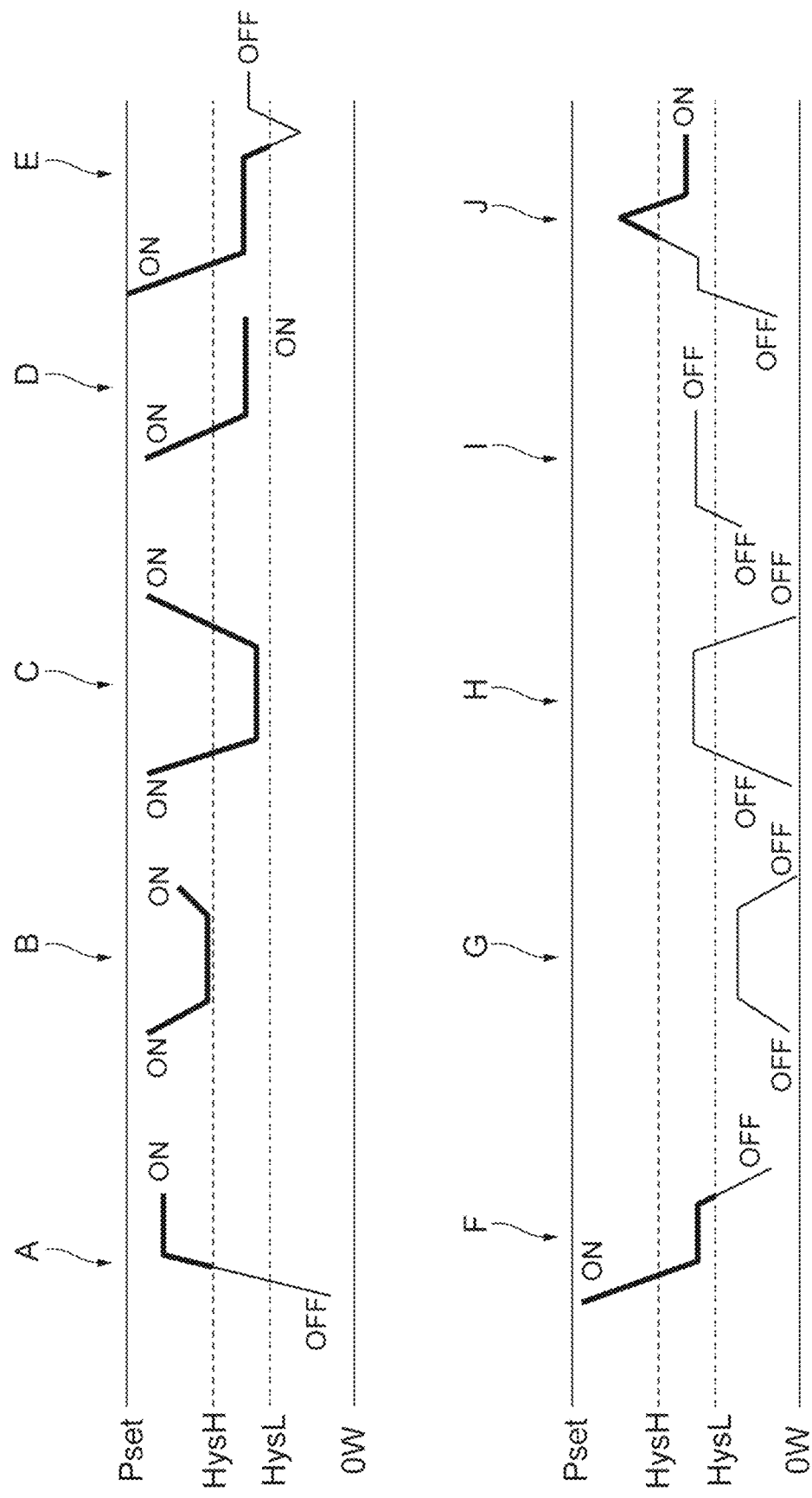
FIG. 8 is a diagram for explaining an example of determination using a threshold value with hysteresis.

FIG. 8 is a diagram for explaining an example of determination using threshold value with hysteresis. FIG. 8 illustrates travelling wave power of a microwave and ON/OFF determination results. As illustrated in FIG. 8, the high level threshold value HysH and the low level threshold value HysL are set between 0 W and the high level setting power Pset. The measurement control unit 167 determines ON and OFF of travelling wave power of a microwave by using the high level threshold value HysH and the low level threshold value HysL.

In a waveform in (A) of FIG. 8, a signal which is equal to or less than the low level threshold value HysL rises exceeding the low level threshold value HysL and the high level threshold value HysH. In this case, the measurement control unit 167 determines that the signal changes from an OFF state to an ON state when the signal is equal to or more than the high level threshold value HysH.

In a waveform in (B) of FIG. 8, a signal which is equal to or more than the high level threshold value HysH decreases and increases in a region which is equal to or more than the high level threshold value HysH. In this case, the measurement control unit 167 determines that the signal is maintained in an ON state.

In a waveform in (C) of FIG. 8, a signal which is equal to or more than the high level threshold value HysH decreases to the high level threshold value HysH or less and the low level threshold value HysL or more, and increases to the high level threshold value HysH or more again. In this case, the measurement control unit 167 determines that the signal is maintained in an ON state. In other words, the measurement control unit 167 determines that the signal is in an ON state even if the signal is equal to or less than the high level threshold value HysH.

In a waveform in (D) of FIG. 8, a signal which is equal to or more than the high level threshold value HysH decreases to the high level threshold value HysH or less and the low level threshold value HysL or more, and has a constant value in the state. In this case, the measurement control unit 167 determines that the signal is maintained in an ON state. In other words, the measurement control unit 167 determines that the signal is in an ON state even if the signal is equal to or less than the high level threshold value HysH.

In a waveform in (E) of FIG. 8, a signal which is equal to or more than the high level threshold value HysH decreases to the low level threshold value HysL or less, and then increases to the low level threshold value HysL or more and the high level threshold value HysH or less. In this case, the measurement control unit 167 determines that the signal changes from an ON state to an OFF state when the signal is equal to or less than the low level threshold value HysL. In other words, the measurement control unit 167 determines that the signal is in an OFF state even if the signal is equal to or more than the low level threshold value HysL.

In a waveform in (F) of FIG. 8, a signal which is equal to or more than the high level threshold value HysH decreases to the low level threshold value HysL or less. In this case, the measurement control unit 167 determines that the signal changes from an ON state to an OFF state when the signal is equal to or less than the low level threshold value HysL.

In a waveform in (G) of FIG. 8, a signal which is equal to or less than the low level threshold value HysL increases and decreases without being equal to or more than the low level threshold value HysL. In this case, the measurement control unit 167 determines that the signal is maintained in an OFF state.

In a waveform in (H) of FIG. 8, a signal which is equal to or less than the low level threshold value HysL increases to the low level threshold value HysL or more and the high level threshold value HysH or less, and decreases to the low level threshold value HysL or less again. In this case, the measurement control unit 167 determines that the signal is maintained in an OFF state. In other words, the measurement control unit 167 determines that the signal is in an OFF state even if the signal is equal to or more than the low level threshold value HysL.

In a waveform in (I) of FIG. 8, a signal which is equal to or less than the low level threshold value HysL increases to the low level threshold value HysL or more and the high level threshold value HysH or less, and has a constant value in the state. In this case, the measurement control unit 167 determines that the signal is maintained in an OFF state. In other words, the measurement control unit 167 determines that the signal is in an OFF state even if the signal is equal to or more than the low level threshold value HysL.

In a waveform in (J) of FIG. 8, a signal which is equal to or less than the low level threshold value HysL increases to the high level threshold value HysH or more, and then decreases to the low level threshold value HysL or more and the high level threshold value HysH or less. In this case, the measurement control unit 167 determines that the signal changes from an OFF state to an ON state when the signal is equal to or more than the high level threshold value HysH. The measurement control unit 167 determines that the signal is in an ON state even if the signal is equal to or less than the high level threshold value HysH.

As mentioned above, as a hysteresis threshold value process, the measurement control unit 167 determines that a signal changes from an OFF state to an ON state only when the signal is equal to or more than the high level threshold value HysH while increasing. As a hysteresis threshold value process, the measurement control unit 167 determines that a signal changes from an ON state to an OFF state only when the signal is equal to or less than the low level threshold value HysL while decreasing.

Example of Setting in Measurement Control Unit

The measurement control unit 167 may be set to perform measurement in a range in which a measurement error is reduced. The measurement error includes frequency accuracy and a duty ratio error. The frequency accuracy is an error of a detection pulse frequency with respect to a setting pulse frequency. As a specific example, the frequency accuracy is expressed by the following Equation (2).

Frequency accuracy [%]=|(detection frequency−setting frequency)/(setting frequency)|×100    (2)

Here, in a case where a computation value of the right side in Equation (2) is equal to or more than 100%, the frequency accuracy is set to 100%. The duty ratio error is an error of a detection duty ratio with respect to a setting duty ratio. As a specific example, the duty ratio error is expressed by the following Equation (3).

Duty ratio error [%]=|detection duty ratio−setting duty ratio|    (3)

The measurement control unit 167 may employ a greater value of the frequency accuracy and the duty ratio error as the maximum error.

The measurement control unit 167 is set to be operated, for example, in the following range such that the maximum error is reduced. In a case where hysteresis threshold values for determining a high level and a low level of travelling wave power of a microwave detected by the first wave detection unit 168 are defined according to Equation (1), the measurement control unit 167 acquires a frequency and a duty ratio of the travelling wave power of the microwave by using a hysteresis ratio and a movement average time included in a first region R1 or a second region R2 on a coordinate plane in which a longitudinal axis expresses a hysteresis ratio, and a transverse axis expresses a movement average time.

Figure 24A:
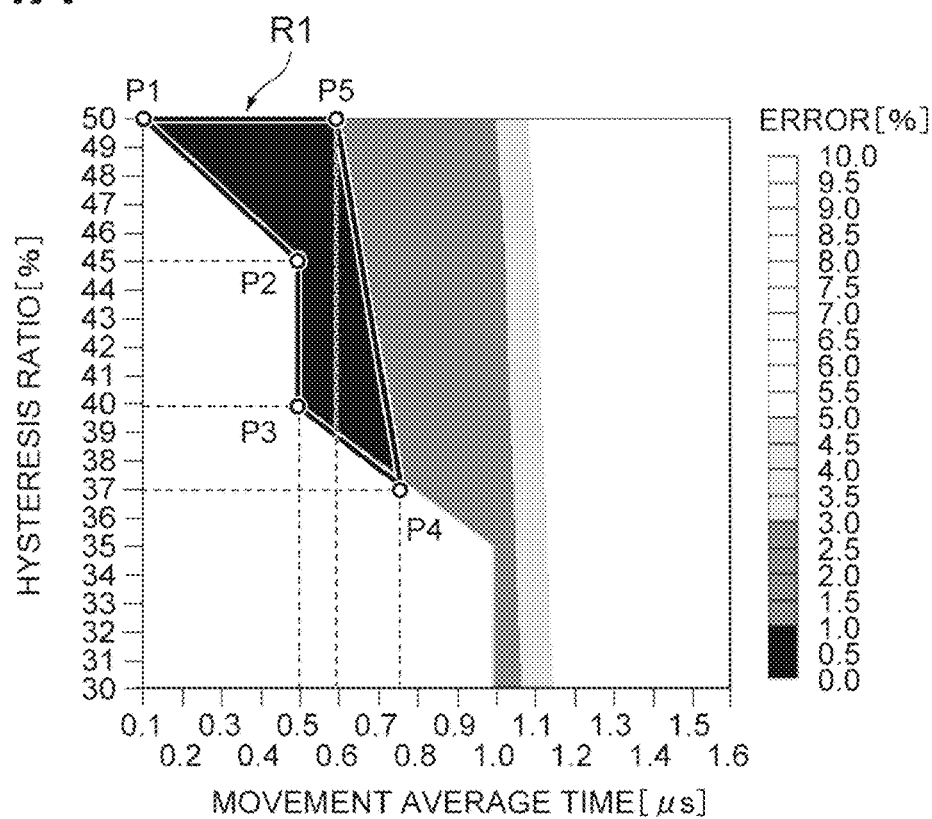
FIGS. 24A and 24B are graphs illustrating a first region and a second region in the simulation result indicating the relationship between a hysteresis ratio and a movement average time.
Figure 24B:
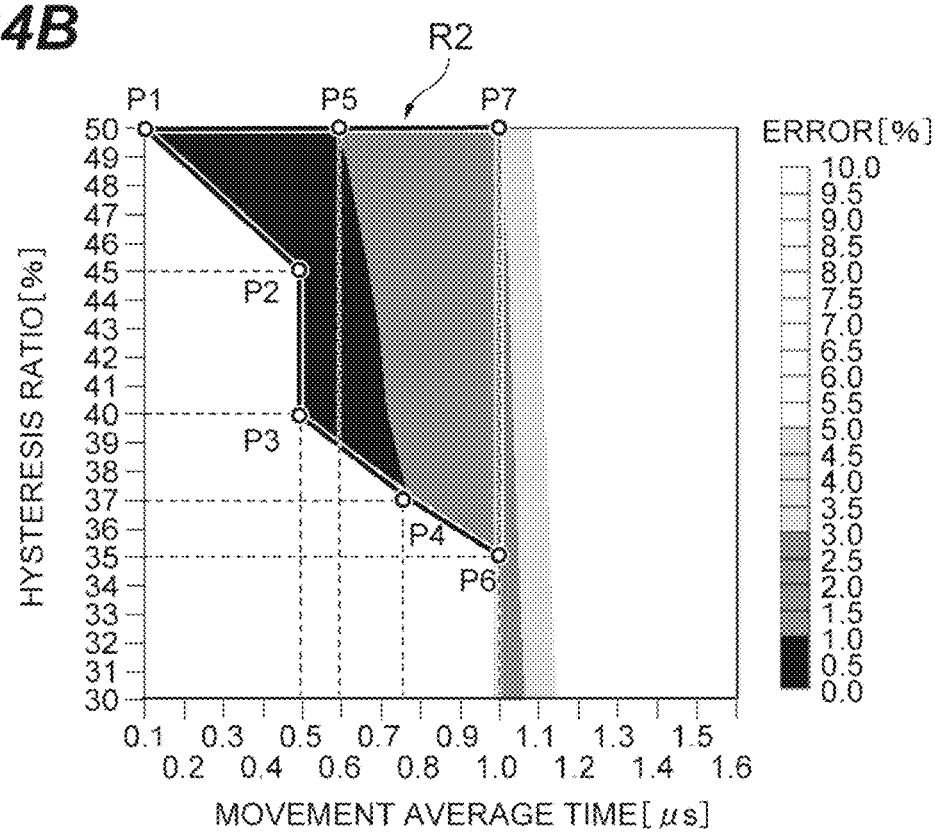

FIGS. 24A and 24B are graphs illustrating the first region R1 and the second region R2 in a simulation result indicating a relationship between a hysteresis ratio and a movement average time. FIG. 24A is a contour diagram in which a transverse axis expresses a movement average time, a longitudinal axis expresses the hysteresis ratio Hys, and the maximum error is a parameter. The first region R1 is a region in which the maximum error is 1% or less. Specifically, the first region R1 is a closed region obtained by connecting, with line segments, a first point P1 at which the hysteresis ratio is 50% and the movement average time is 0.1 μs, a second point P2 at which the hysteresis ratio is 45% and the movement average time is 0.5 μs, a third point P3 at which the hysteresis ratio is 40% and the movement average time is 0.5 μs, a fourth point P4 at which the hysteresis ratio is 37% and the movement average time is 0.75 μs, and a fifth point P5 at which the hysteresis ratio is 50% and the movement average time is 0.6 μs to each other in an order of the first point P1, the second point P2, the third point P3, the fourth point P4, and the fifth point P5, and the first point P1.

FIG. 24B is a contour diagram in which a transverse axis expresses a movement average time, a longitudinal axis expresses the hysteresis ratio Hys, and the maximum error is a parameter. The second region R2 is a region in which the maximum error is 3% or less. Specifically, the second region R2 is a closed region obtained by connecting, with line segments, a first point P1 at which the hysteresis ratio is 50% and the movement average time is 0.1 μs, a second point P2 at which the hysteresis ratio is 45% and the movement average time is 0.5 μs, a third point P3 at which the hysteresis ratio is 40% and the movement average time is 0.5 μs, a sixth point P6 at which the hysteresis ratio is 35% and the movement average time is 1.0 μs, and a seventh point P7 at which the hysteresis ratio is 50% and the movement average time is 1.0 μs to each other in an order of the first point P1, the second point P2, the third point P3, the sixth point P6, and the seventh point P7, and the first point P1.

Conclusion of First Exemplary Embodiment

In the pulse monitor device 10, the first wave detection unit 168 detects a measured value corresponding to travelling wave power of a microwave in the wave guide tube, and the measurement control unit 167 acquires a frequency and a duty ratio of the travelling wave power. Thus, the pulse monitor device 10 can monitor a pulse frequency and a duty ratio of a microwave which is input to a processing container in a case where power of the microwave having a bandwidth is pulse-modulated.

In the pulse monitor device 10, in a case where hysteresis threshold values are defined according to Equation (1), a frequency and a duty ratio of travelling wave power of a microwave are acquired by using a hysteresis ratio and a movement average time included in the first region R1 or the second region R2. Consequently, the pulse monitor device 10 can make an error of a detection pulse frequency with respect to a setting pulse frequency and an error of a detection duty ratio with respect to a setting duty ratio 1% to 3% or less. Therefore, the pulse monitor device 10 can accurately monitor a pulse frequency and a duty ratio of a microwave which is input to a processing container.

According to the pulse monitor device 10, it is possible to monitor travelling wave power of a microwave on a primary side of the tuner 26. The plasma processing apparatus 1 including the pulse monitor device 10 achieves the same effects as in the pulse monitor device 10.

Second Exemplary Embodiment

A pulse monitor device 10A according to a second exemplary embodiment is the same as the pulse monitor device 10 according to the first exemplary embodiment except that a control unit of the tuner 26 functions as a pulse monitor device. Hereinafter, a difference between the pulse monitor device 10A and the pulse monitor device 10 will be focused, and repeated description will not be made.

Figure 9:
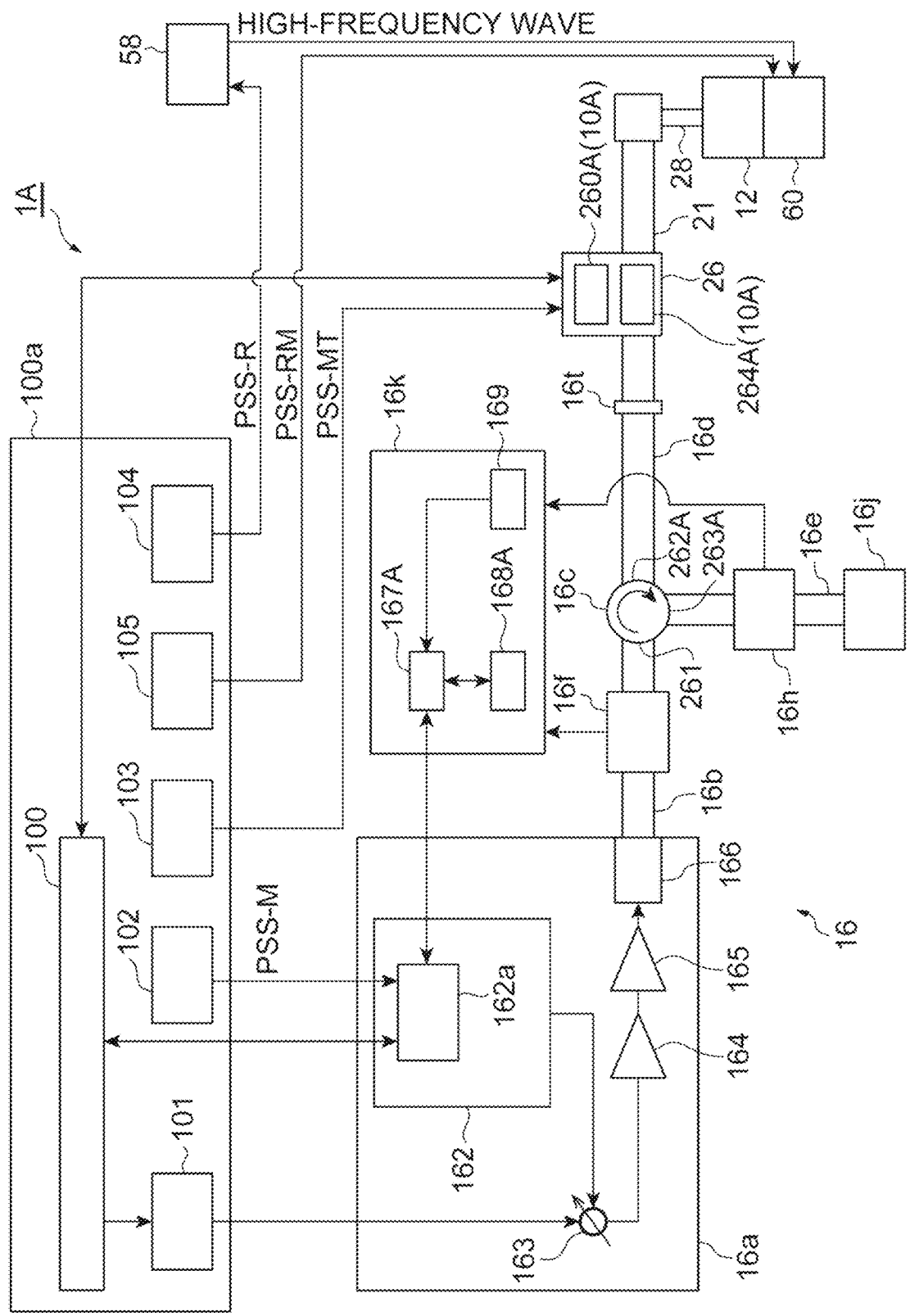
FIG. 9 is a diagram illustrating another example of a pulse monitor device.

FIG. 9 is a diagram illustrating another example of a pulse monitor device. As illustrated in FIG. 9, the measurement unit 16k includes a measurement control unit 167A and a first wave detection unit 168A. The measurement control unit 167A and the first wave detection unit 168A are the same as the measurement control unit 167 and the first wave detection unit 168 except that a pulse monitor function is not provided.

The tuner 26 includes a tuner control unit 260A (an example of an acquisition unit) and a tuner wave detection unit 264A (an example of a wave detection unit). The tuner control unit 260A and the tuner wave detection unit 264A are the same as the tuner control unit 260 and the tuner wave detection unit 264 except that a pulse monitor function is provided. In other words, the tuner control unit 260A branches a wave detection signal detected by the tuner wave detection unit 264A so as to acquire a frequency and a duty ratio of travelling wave power of a microwave. As mentioned above, the pulse monitor device 10A is configured to include the tuner control unit 260A and the tuner wave detection unit 264A. The pulse monitor device 10A is not necessarily used as the tuner 26, and may be added separately from a configuration of the tuner 26. Monitoring ways, that is, a hysteresis ratio, a movement average time, and a hysteresis threshold value are the same as in the first exemplary embodiment.

A configuration of the plasma processing apparatus 1A is the same as the configuration of the plasma processing apparatus 1 except for the above description.

Conclusion of Second Exemplary Embodiment

According to the pulse monitor device 10A, it is possible to monitor a pulse frequency and a duty ratio of a microwave which is input to a processing container. According to the pulse monitor device 10A, it is possible to accurately monitor a pulse frequency and a duty ratio of a microwave which is input to a processing container.

According to the pulse monitor device 10A, it is possible to monitor travelling wave power of a microwave in the tuner 26. The plasma processing apparatus 1A including the pulse monitor device 10A achieves the same effects as in the pulse monitor device 10A.

Third Exemplary Embodiment

A pulse monitor device 10B according to a third exemplary embodiment is the same as the pulse monitor device 10 according to the first exemplary embodiment except that a demodulation unit 80 and a demodulation control unit 81 are provided. Hereinafter, a difference between the pulse monitor device 10B and the pulse monitor device 10 will be focused, and repeated description will not be made.

Figure 10:
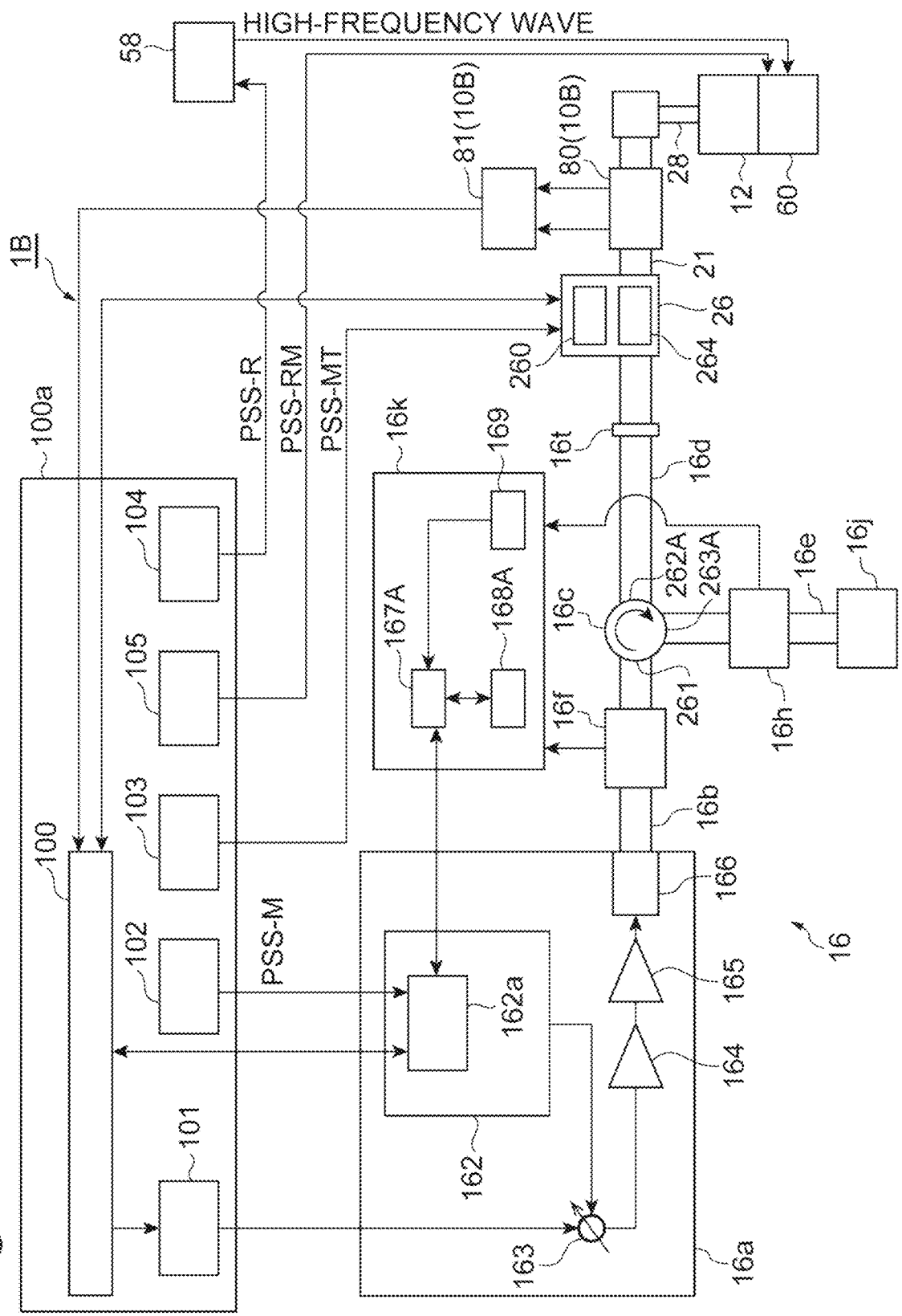
FIG. 10 is a diagram illustrating still another example of a pulse monitor device.

FIG. 10 is a diagram illustrating still another example of a pulse monitor device. As illustrated in FIG. 10, the measurement unit 16k includes a measurement control unit 167A and a first wave detection unit 168A. The measurement control unit 167A and the first wave detection unit 168A are the same as the measurement control unit 167 and the first wave detection unit 168 except that a pulse monitor function is not provided.

A plasma processing apparatus 1B includes the demodulation unit 80 (an example of a wave detection unit) and the demodulation control unit 81 (an example of an acquisition unit). The demodulation unit 80 is provided between, for example, the tuner 26 and the antenna 18 (refer to FIG. 1) in the wave guide tube 21. The demodulation unit 80 acquires travelling wave power which is power of a travelling wave which travels through the wave guide tube 21 and reflected wave power which is power of a reflected wave on the antenna 18 side.

The demodulation unit 80 has a directional coupler. The directional coupler is, for example, a bidirectional coupler having four ports. The directional coupler is configured to branch parts of microwaves (that is, travelling waves) which are output from the microwave generation unit 16a and propagate through the wave guide tube 21, and to output the parts of the travelling waves. Similarly, the directional coupler is configured to branch parts of microwaves (that is, reflected waves) returning from the mode converter, and to output the parts of the reflected waves.

The demodulation control unit 81 is a calculator including a processor and a memory. The demodulation control unit 81 measures travelling wave power in the directional coupler on the basis of the parts of the travelling waves output from the directional coupler. Similarly, the demodulation control unit 81 measures reflected wave power in the directional coupler on the basis of the parts of the reflected waves output from the directional coupler.

The pulse monitor device 10B is configured to include the demodulation unit 80 and the demodulation control unit 81. The pulse monitor device 10B is not necessarily used as the demodulation unit 80 and the demodulation control unit 81, and may be added separately from the configurations of the demodulation unit 80 and the demodulation control unit 81. Monitoring ways, that is, a hysteresis ratio, a movement average time, and a hysteresis threshold value are the same as in the first exemplary embodiment.

A configuration of the plasma processing apparatus 1B is the same as the configuration of the plasma processing apparatus 1 except for the above description.

Conclusion of Third Exemplary Embodiment

According to the pulse monitor device 10B, it is possible to monitor a pulse frequency and a duty ratio of a microwave which is input to a processing container. According to the pulse monitor device 10B, it is possible to accurately monitor a pulse frequency and a duty ratio of a microwave which is input to a processing container. According to the pulse monitor device 10B, it is possible to monitor travelling wave power of a microwave on a secondary side of the tuner 26. The plasma processing apparatus 1B including the pulse monitor device 10B achieves the same effects as in the pulse monitor device 10B.

As mentioned above, various exemplary embodiments have been described, but the invention is not limited to the exemplary embodiments, and may be variously modified.

In the exemplary embodiments, a description has been made of an example in which the microwave generation unit 16a and the waveform generator 101 are separately configured, but the microwave generation unit 16a and the waveform generator 101 may be configured as a single device. A description has been made of an example in which the calculation device 100a includes the first pulse generator 102 to the fourth pulse generator 105, but this is only an example. For example, the power control unit 162 may include the first pulse generator 102.

In a case where the plasma processing apparatus employs only a mode using travelling wave power of a microwave, the measurement unit 16k may not have a configuration of measuring a reflected wave.

The measurement control unit 167 of the pulse monitor device 10, the tuner control unit 260A of the pulse monitor device 10A, and the demodulation control unit 81 of the pulse monitor device 10B may have a warning function. Hereinafter, the measurement control unit 167 will be described as an example of a warning unit. The measurement control unit 167 may refer to a threshold value set in advance for a pulse frequency or a duty ratio measured by the first wave detection unit 168. A threshold value may be separately set for a pulse frequency and a duty ratio, and may be set for either of the pulse frequency and the duty ratio. A threshold value may be set on the basis of a simulation result or a past measurement result. The measurement control unit 167 compares a pulse frequency or a duty ratio which is being monitored with a predetermined threshold value. The measurement control unit 167 outputs a warning on the basis of a comparison result. The type of warning is not limited. For example, a warning screen may be displayed on a monitor screen, and an alarming sound may be output. Alternatively, a log indicating abnormality may be recorded in a recording device, and a signal indicating detection of abnormality may be output to the calculation device 100a of the plasma processing apparatus. The tuner control unit 260A and the demodulation control unit 81 may have the same function as the warning function of the measurement control unit 167. The warning function is provided, and thus the pulse monitor devices 10, 10A, and 10B can detect that a microwave is not output as set. The controller 100 of the apparatus side may have the warning function.

The pulse monitor devices 10, 10A, and 10B or the controller 100 has the warning function, and can thus detect abnormality in a case of an inappropriate process for pulse setting. Thus, a process on a wafer can be reliably performed for setting, and it is possible to prevent in advance wafer processing from being performed in a state in which abnormality occurs.

EXAMPLES

Hereinafter, a description will be made of simulation results for explaining effects of the present disclosure.

Relationship Between Waveform of Travelling Wave Power and Movement Average Time Waveforms of power of a microwave having a bandwidth and power of a pulse-modulated microwave having a bandwidth were checked through simulation. The influence which a movement average time has on a waveform was verified. Regarding simulation conditions, the setting power Pset was set to 2500 W, and a bandwidth was set to 10 MHz. A setting duty ratio in pulse modulation was set to 10%, and a setting pulse frequency was set to 20 kHz. A pulse modulation method was ON/OFF modulation. A movement average time was set to 0.1 µs to 40 µs. Simulation results are illustrated in FIGS. 11A to 11E.

Figure 11A:
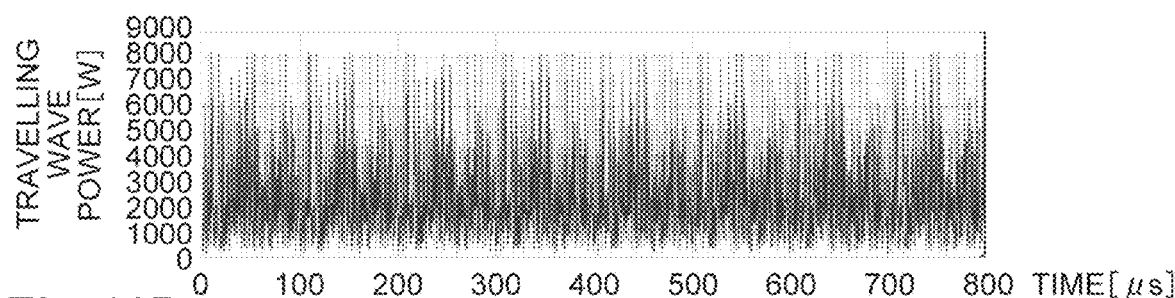
FIGS. 11A to 11E are graphs illustrating results of simulating a relationship between power amplitude of a pulse-modulated microwave (setting power of 2500 W) and time every movement average time.

FIGS. 11A to 11E illustrate results of simulating a relationship between power amplitude of a pulse-modulated microwave (setting power of 2500 W) and time every movement average time. A graph in FIG. 11A illustrates a waveform of a microwave which has a bandwidth and is not pulse-modulated. A transverse axis expresses time, and a longitudinal axis expresses travelling wave power. In a case of the setting power of 2500 W, the travelling wave power was checked to oscillate vertically in a range of 0 W to 8200 W. 8200 W which is an upper limit of power is a detection range in an A/D converter forming an electronic circuit of the measurement control unit 167. The time required for rising and falling was about 10 ns.

Figure 11B:
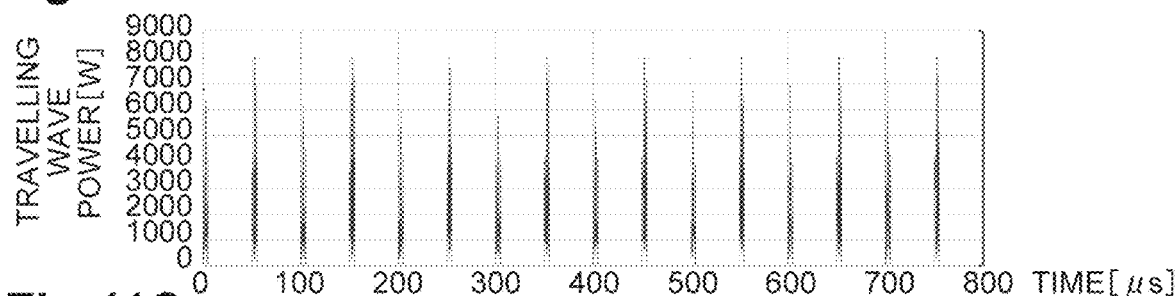
Figure 11C:
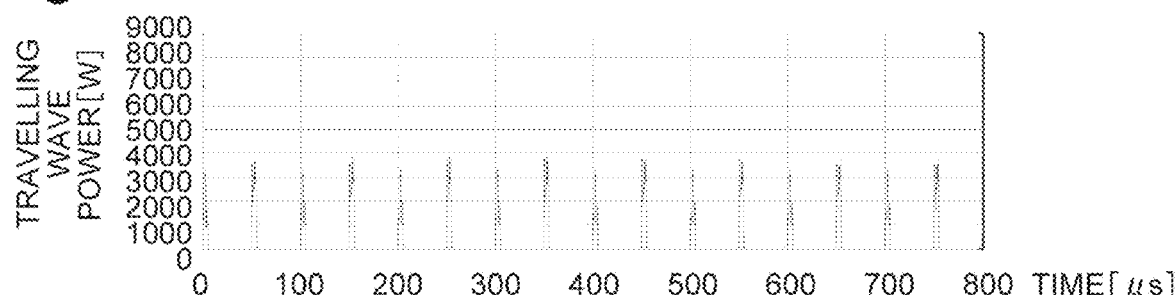
Figure 11D:
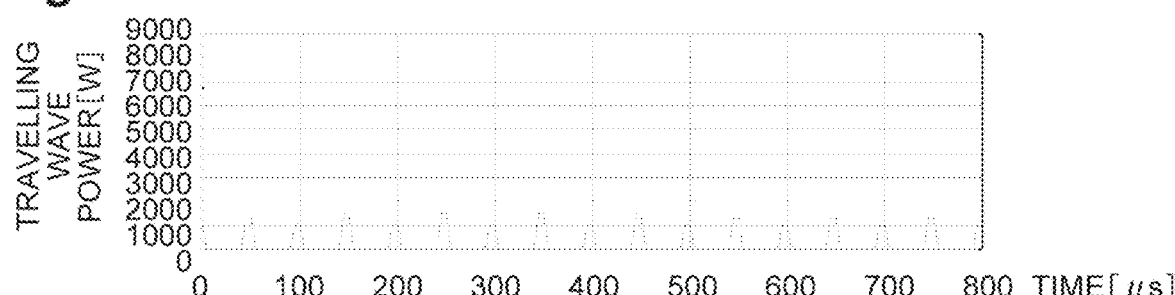
Figure 11E:
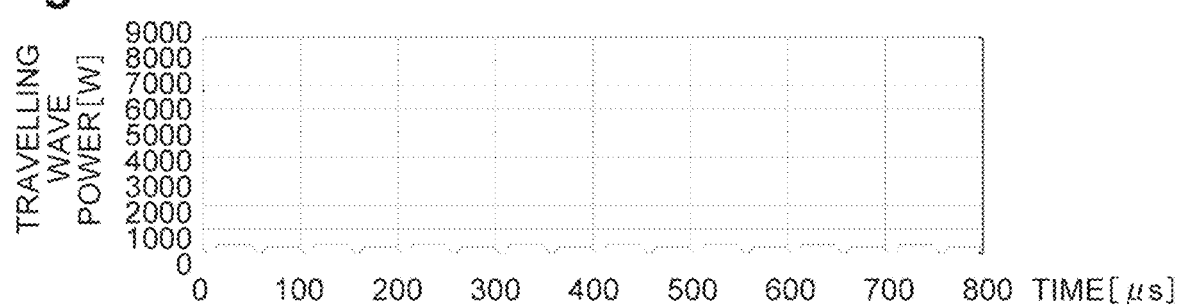

FIGS. 11B to 11E are graphs illustrating waveforms in a case where the microwave in the graph in FIG. 11A is pulse-modulated. The graph in FIG. 11B illustrates a waveform in a case where a movement average time is 0.1 µs. The graph in FIG. 11C illustrates a waveform in a case where a movement average time is 1.0 µs. The graph in FIG. 11D illustrates a waveform in a case where a movement average time is 10.0 µs. The graph in FIG. 11E illustrates a waveform in a case where a movement average time is 40.0 µs. As illustrated in the graphs in FIGS. 11B to 11E, it can be seen that upper limit values and lower limit values are different from each other for the respective pulses. It can be seen that, if a movement average time is increased, oscillation is averaged such that a pulse shape becomes clear. It is checked that, if a movement average time is increased, blunting of travelling wave power at the OFF time tends to be constant.

Similarly, a case of setting power of 500 W was simulated. Simulation conditions are identical except for the setting power. Simulation results are illustrated in FIGS. 12A to 12E.

Figure 12A:
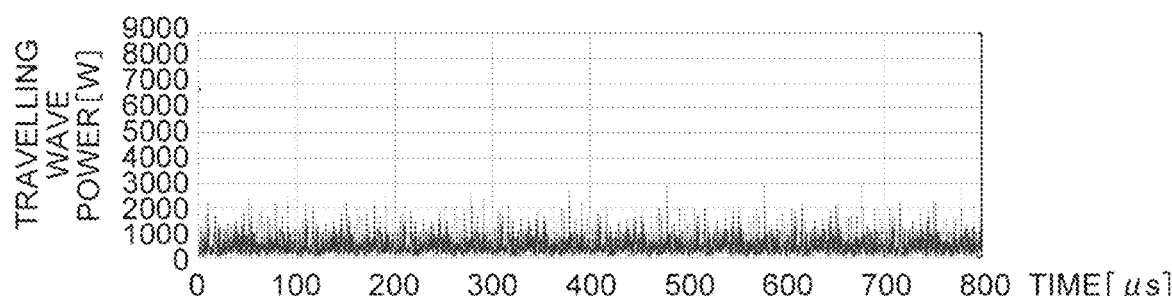
FIGS. 12A to 12E are graphs illustrating results of simulating a relationship between power amplitude of a pulse-modulated microwave (setting power of 500 W) and time every movement average time.

FIGS. 12A to 12E illustrate results of simulating a relationship between power amplitude of a pulse-modulated microwave (setting power of 500 W) and time every movement average time. A graph in FIG. 12A illustrates a waveform of a microwave which has a bandwidth and is not pulse-modulated. A transverse axis expresses time, and a longitudinal axis expresses travelling wave power. In a case of the setting power of 500 W, the travelling wave power was checked to oscillate vertically in a range of 0 W to 3000 W. The time required for rising and falling was about 10 ns.

Figure 12B:
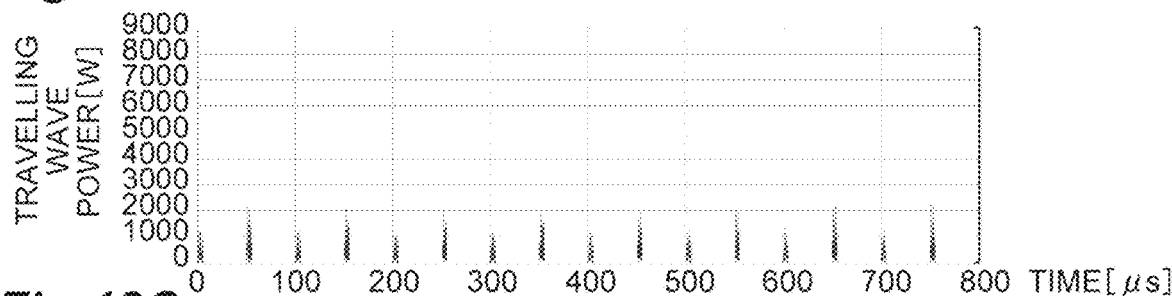
Figure 12C:
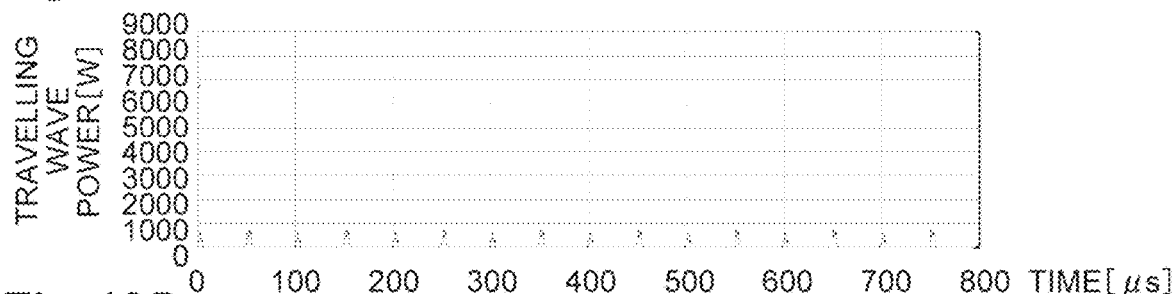
Figure 12D:
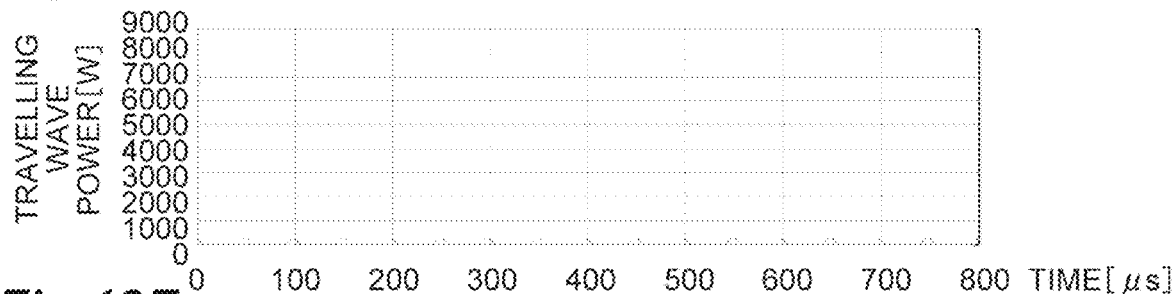
Figure 12E:
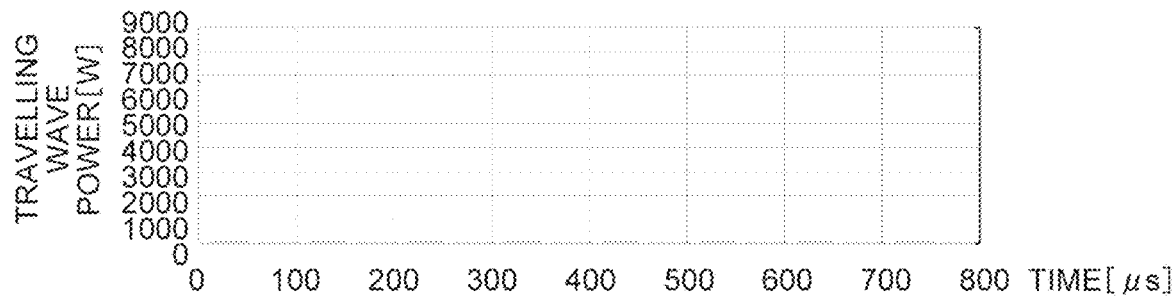

FIGS. 12B to 12E are graphs illustrating waveforms in a case where the microwave in the graph in FIG. 12A is pulse-modulated. The graph in FIG. 12B illustrates a waveform in a case where a movement average time is 0.1 µs. The graph in FIG. 12C illustrates a waveform in a case where a movement average time is 1.0 µs. The graph in FIG. 12D illustrates a waveform in a case where a movement average time is 10.0 µs. The graph in FIG. 12E illustrates a waveform in a case where a movement average time is 40.0 µs. As illustrated in the graphs in FIGS. 12B to 12E, the same tendencies as in the case of the setting power of 2500 W are checked. In other words, it is checked that there are tendencies that, if a movement average time is increased, oscillation is averaged such that a pulse shape becomes clear, and blunting of travelling wave power at the OFF time is constant.

Relationship Between Waveform of Travelling Wave Power and Duty Ratio

The influence which a duty ratio has on a waveform was verified through simulation. Regarding simulation conditions, the setting power Pset was set to 2500 W, and a bandwidth was set to 10 MHz. A setting pulse frequency in pulse modulation was set to 20 kHz. A pulse modulation method was ON/OFF modulation. A movement average time was set to 0.1 µs. A setting duty ratio in pulse modulation was set to 10%, 50%, and 90%, and waveforms were checked. Simulation results are illustrated in FIGS. 13A to 13C.

Figure 13A:
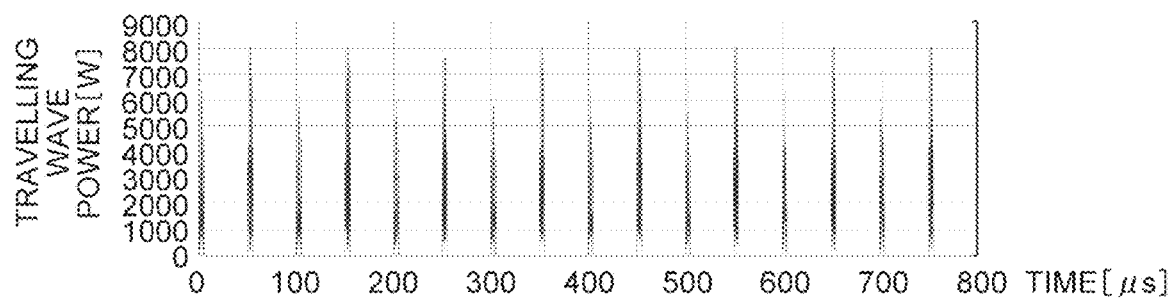
FIGS. 13A to 13C are graphs illustrating results of simulating a relationship between power amplitude of a pulse-modulated microwave (movement time of 0.1 μs) and time every duty ratio.
Figure 13B:
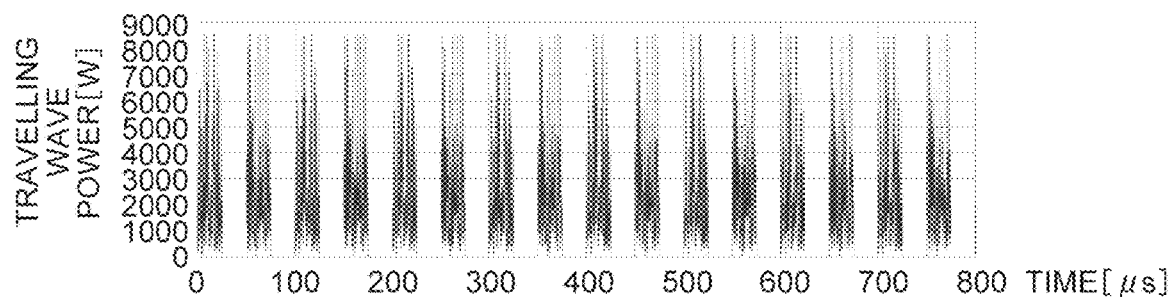
Figure 13C:
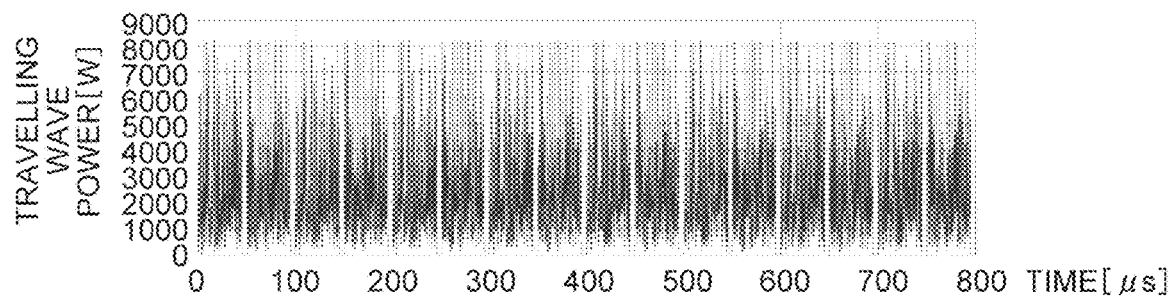

FIGS. 13A to 13C illustrate results of simulating a relationship between power amplitude of a pulse-modulated microwave (movement time of 0.1 µs) and time every duty ratio. A graph in FIG. 13A illustrates a waveform at a duty ratio of 10%. A graph in FIG. 13B illustrates a waveform at a duty ratio of 50%. A graph in FIG. 13C illustrates a waveform at a duty ratio of 90%. As illustrated in the graphs in FIGS. 13A to 13C, it is checked that there is a tendency that, if a duty ratio is increased, it is hard to determine an OFF time of a waveform.

Similarly, a case of a movement average time of 1 µs was simulated. Simulation conditions are identical except for the duty ratio. Simulation results are illustrated in FIGS. 14A to 14C.

Figure 14A:
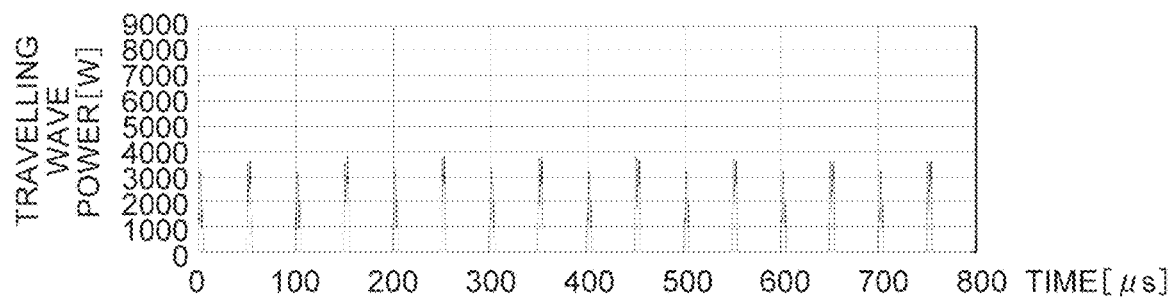
FIGS. 14A to 14C are graphs illustrating results of simulating a relationship between power amplitude of a pulse-modulated microwave (movement time of 1.0 μs) and time every duty ratio.
Figure 14B:
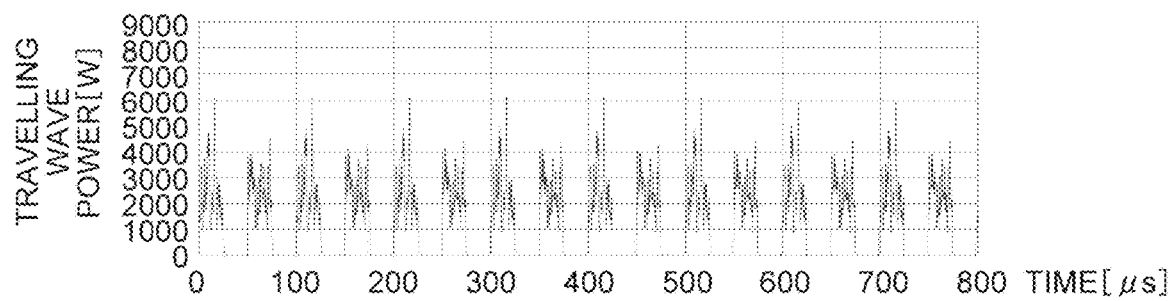
Figure 14C:
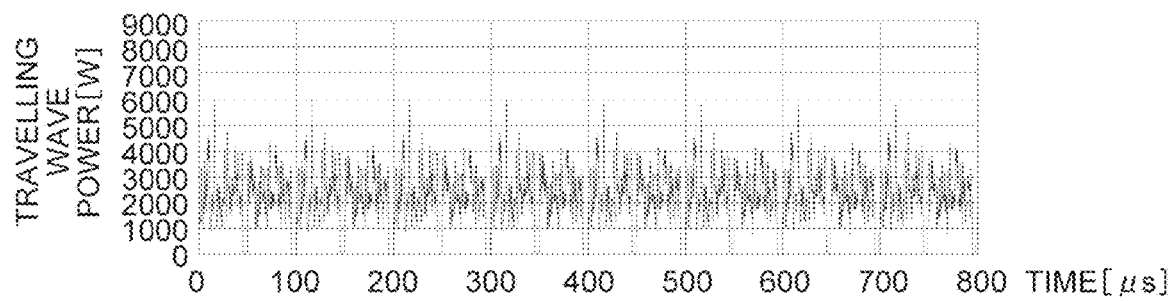

FIGS. 14A to 14C illustrate results of simulating a relationship between power amplitude of a pulse-modulated microwave (movement time of 1.0 µs) and time every duty ratio. A graph in FIG. 14A illustrates a waveform at a duty ratio of 10%. A graph in FIG. 14B illustrates a waveform at a duty ratio of 50%. A graph in FIG. 14C illustrates a waveform at a duty ratio of 90%. As illustrated in the graphs in FIGS. 14A to 14C, it is checked that intensities of power are not averaged yet, and there is a tendency that, if a duty ratio is increased, it is hard to determine an OFF time of a waveform.

Similarly, a case of a movement average time of 10.0 µs was simulated. Simulation conditions are identical except for the duty ratio. Simulation results are illustrated in FIGS. 15A to 15C.

Figure 15A:
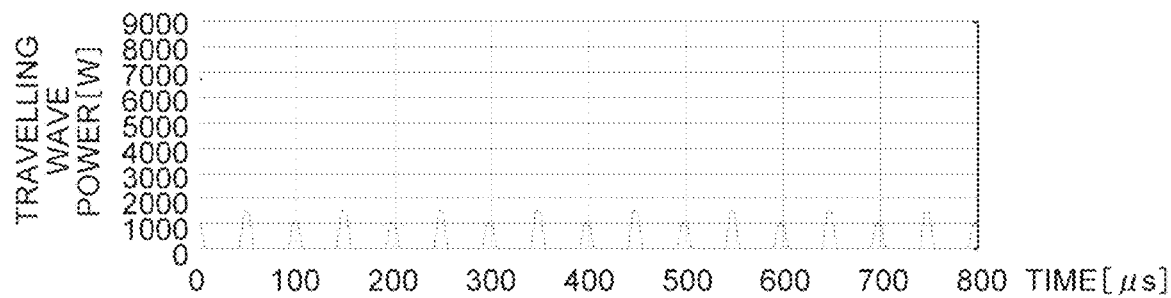
FIGS. 15A to 15C are graphs illustrating results of simulating a relationship between power amplitude of a pulse-modulated microwave (movement time of 10.0 μs) and time every duty ratio.
Figure 15B:
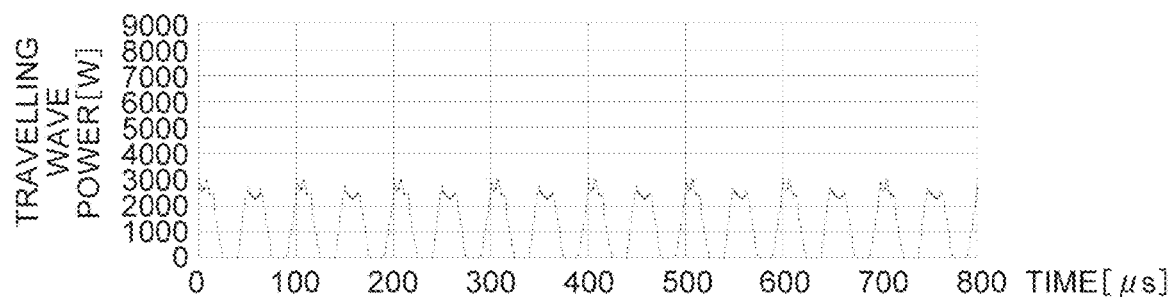
Figure 15C:
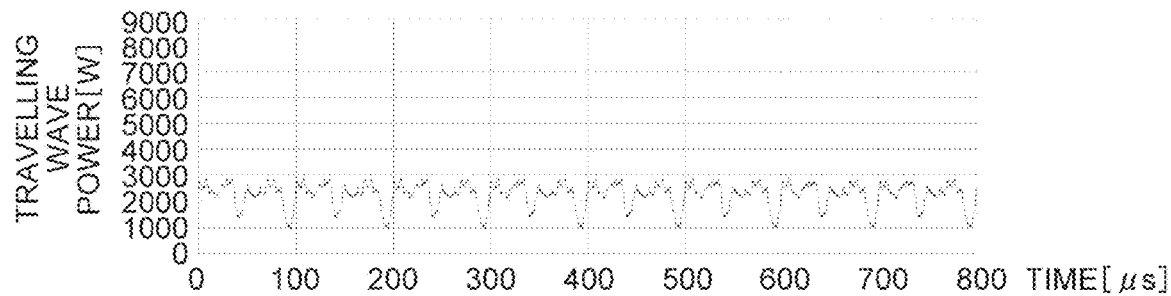

FIGS. 15A to 15C illustrate results of simulating a relationship between power amplitude of a pulse-modulated microwave (movement time of 10.0 µs) and time every duty ratio. A graph in FIG. 15A illustrates a waveform at a duty ratio of 10%. A graph in FIG. 15B illustrates a waveform at a duty ratio of 50%. A graph in FIG. 15C illustrates a waveform at a duty ratio of 90%. As illustrated in the graphs in FIGS. 15A to 15C, intensities of power are increased compared with the cases of the movement average times of 0.1 µs and 1.0 µs, and a pulse waveform can be recognized at the duty ratios of 10% and 50%. However, it is checked that there is a tendency that, if a duty ratio is increased, it is hard to determine an OFF time of a waveform.

Combination of Movement Average Time and Hysteresis Ratio

It was verified through simulation whether or not there is a combination of a movement average time and a hysteresis ratio satisfying the maximum error of a predetermined value or less even if setting power and a setting duty ratio are changed.

A plurality of setting power and setting duty ratios were prepared as simulation conditions. Setting power was set to 500 W to 2500 W, and a setting duty ratio was set to 10% to 90%. More specifically, a condition A was set to include setting power of 2500 W and a setting duty ratio of 10%, a condition B was set to include setting power of 1500 W and a setting duty ratio of 10%, a condition C was set to include setting power of 500 W and a setting duty ratio of 10%, a condition D was set to include setting power of 2500 W and a setting duty ratio of 50%, a condition E was set to include setting power of 1500 W and a setting duty ratio of 50%, a condition F was set to include setting power of 500 W and a setting duty ratio of 50%, a condition G was set to include setting power of 2500 W and a setting duty ratio of 90%, a condition H was set to include setting power of 1500 W and a setting duty ratio of 90%, and a condition I was set to include setting power of 500 W and a setting duty ratio of 90%. In the conditions A to I, a bandwidth was set to 10 MHz. A setting pulse frequency in pulse modulation was set to 20 kHz. A pulse modulation method was ON/OFF modulation. The modification example was evaluated under the conditions. Simulation results are illustrated in FIGS. 16A to 19C. FIGS. 16A to 17C are graphs regarding a frequency error, and FIGS. 18A to 19C are graphs regarding a duty ratio error.

Figure 16A:
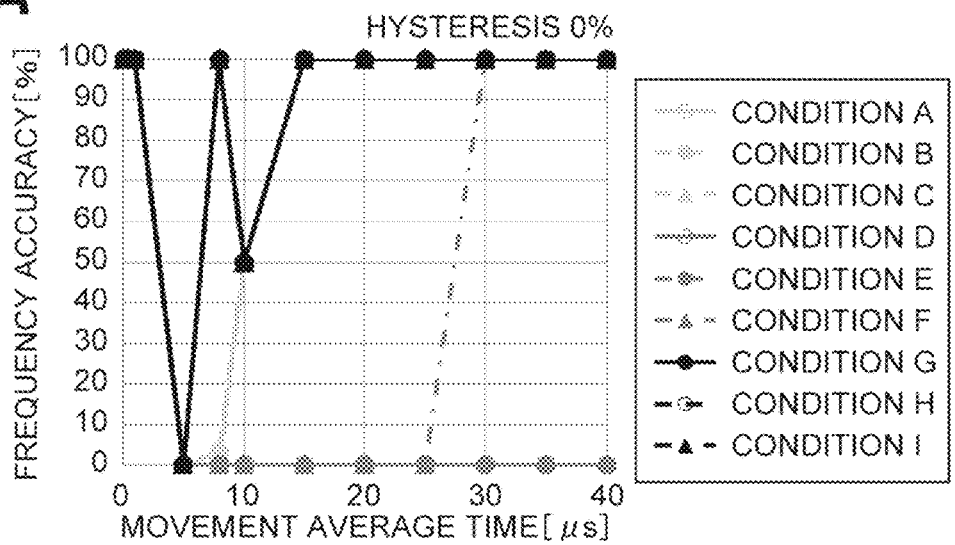
FIGS. 16A to 16C are graphs illustrating results of simulating a relationship between a movement average time and frequency accuracy every hysteresis ratio (0% to 20%).
Figure 16B:
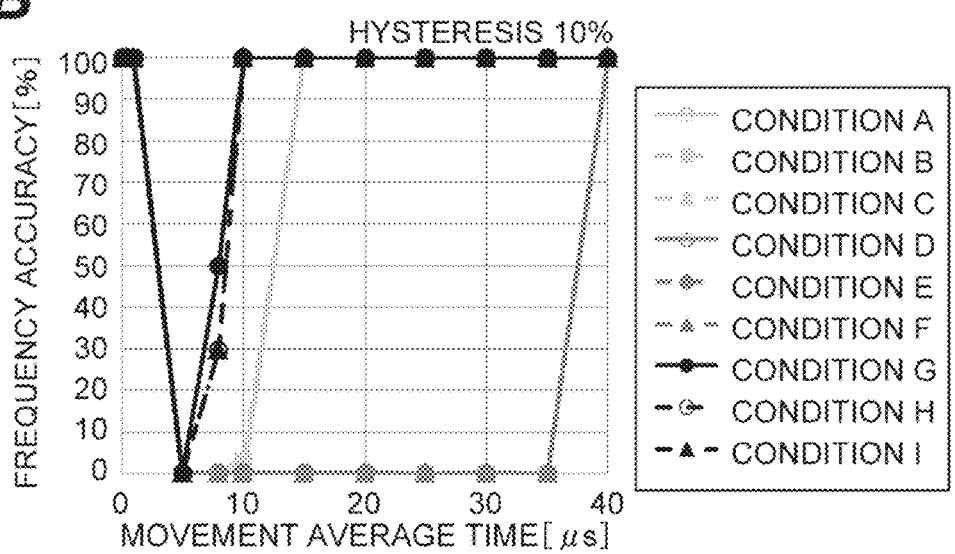
Figure 16C:
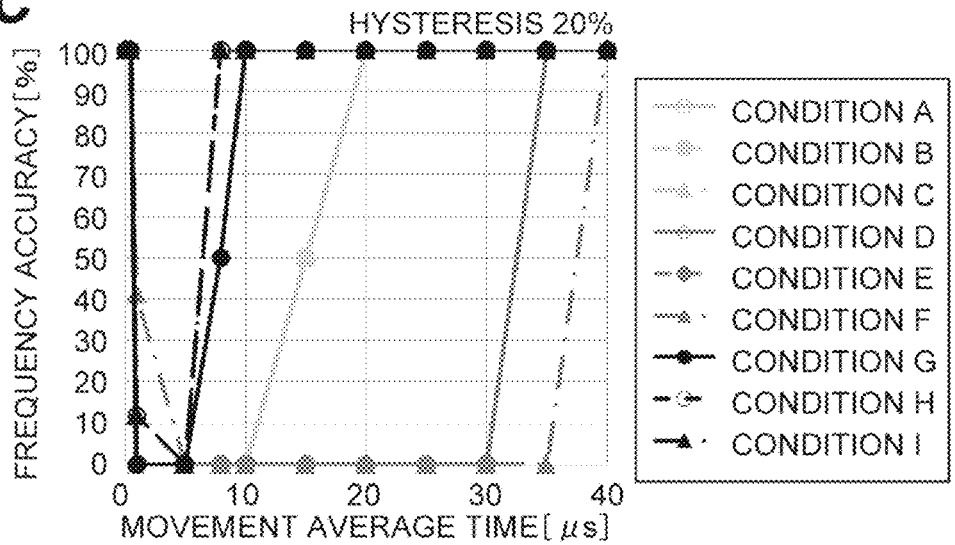

FIGS. 16A to 16C are diagram illustrating results of simulating a relationship between a movement average time and frequency accuracy every hysteresis ratio (0% to 20%). A transverse axis expresses a movement average time, and a longitudinal axis expresses frequency accuracy. A graph in FIG. 16A illustrates a relationship between a movement average time and frequency accuracy at a hysteresis ratio of 0% under the conditions A to I. In the conditions A to I, it is checked that frequency accuracy is high in a range of a movement average time of 0.1 to 5 µs. A graph in FIG. 16B illustrates a relationship between a movement average time and frequency accuracy at a hysteresis ratio of 10% under the conditions A to I. In the conditions A to I, it is checked that frequency accuracy is high in a range of a movement average time of 0.1 to 5 µs. A graph in FIG. 16C illustrates a relationship between a movement average time and frequency accuracy at a hysteresis ratio of 20% under the conditions A to I. In the conditions A to I, it is checked that frequency accuracy is high in a range of a movement average time of 0.1 to 5 µs.

Figure 17A:
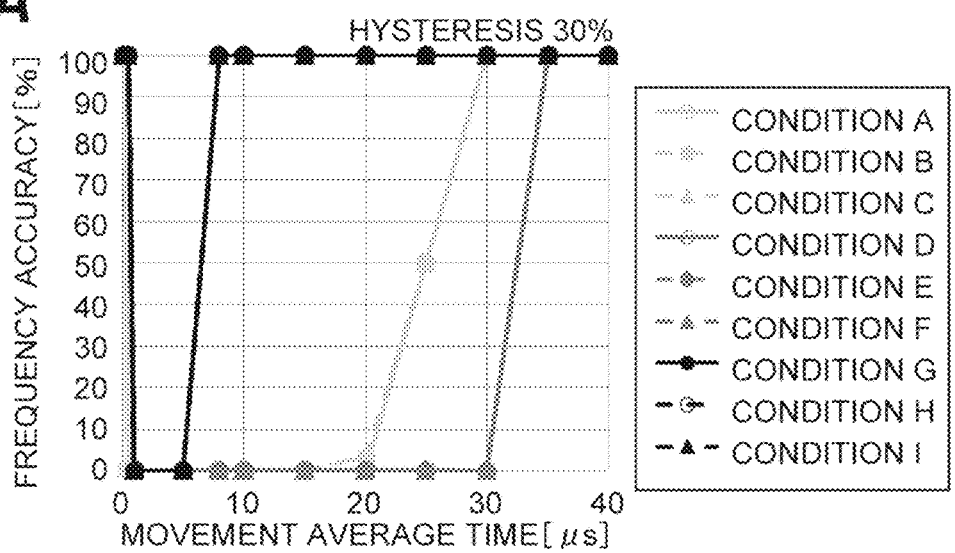
FIGS. 17A to 17C are graphs illustrating results of simulating a relationship between a movement average time and frequency accuracy every hysteresis ratio (30% to 50%).
Figure 17B:
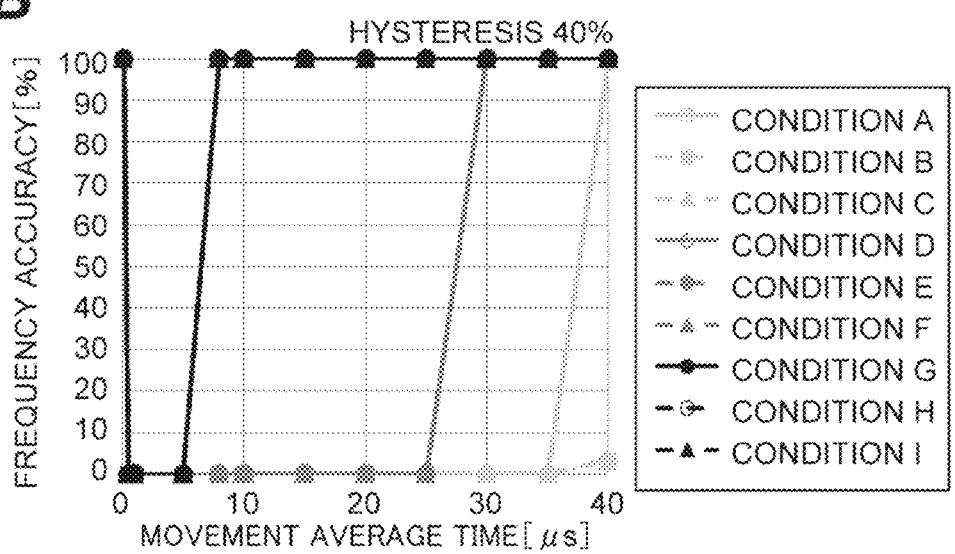
Figure 17C:
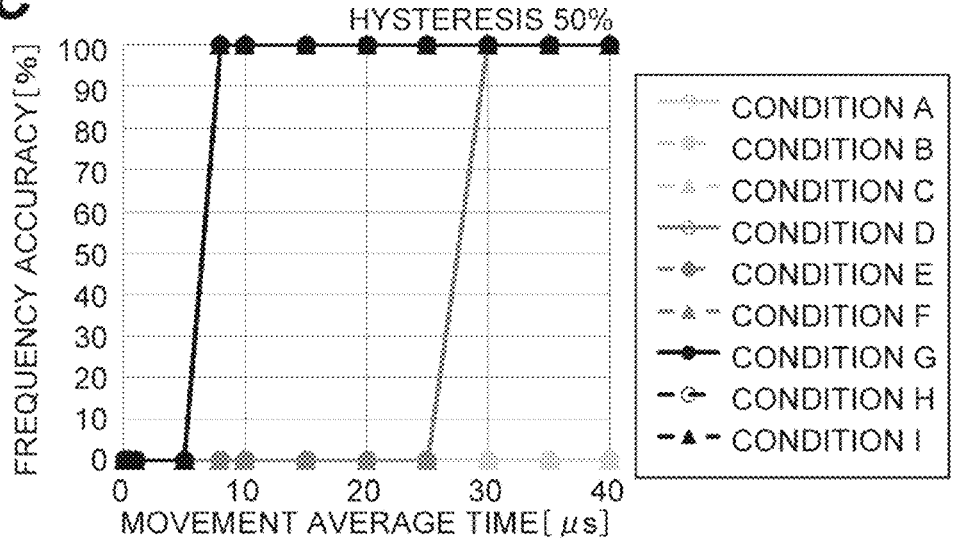

FIGS. 17A to 17C are graphs illustrating results of simulating a relationship between a movement average time and frequency accuracy every hysteresis ratio (30% to 50%). A transverse axis expresses a movement average time, and a longitudinal axis expresses frequency accuracy. A graph in FIG. 17A illustrates a relationship between a movement average time and frequency accuracy at a hysteresis ratio of 30% under the conditions A to I. In the conditions A to I, it is checked that frequency accuracy is high in a range of a movement average time of 0.1 to 5 µs. A graph in FIG. 17B illustrates a relationship between a movement average time and frequency accuracy at a hysteresis ratio of 40% under the conditions A to I. In the conditions A to I, it is checked that frequency accuracy is high in a range of a movement average time of 0.1 to 5 µs. A graph in FIG. 17C illustrates a relationship between a movement average time and frequency accuracy at a hysteresis ratio of 50% under the conditions A to I. In the conditions A to I, it is checked that frequency accuracy is high in a range of a movement average time of 0.1 to 5 µs.

Figure 18A:
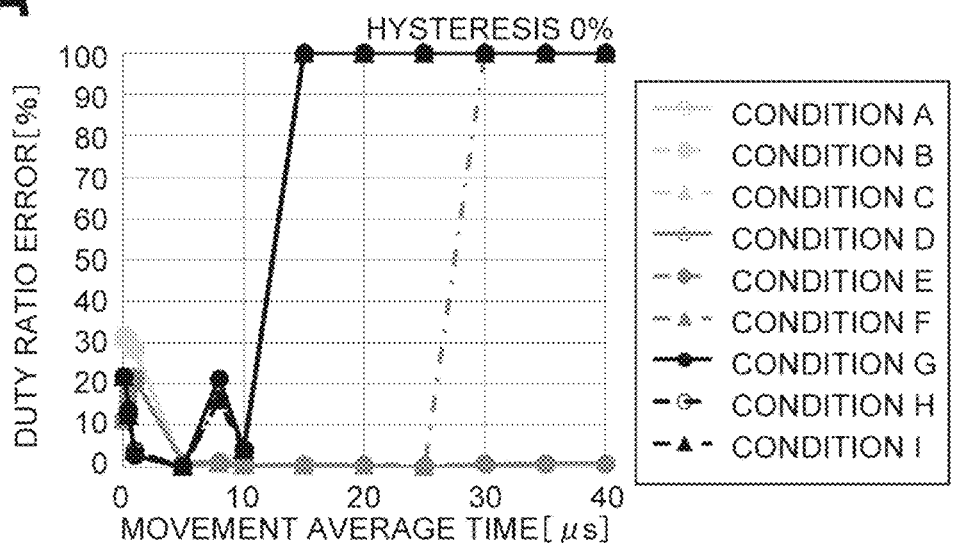
FIGS. 18A to 18C are graphs illustrating results of simulating a relationship between a movement average time and a duty ratio error every hysteresis ratio (0% to 20%).
Figure 18B:
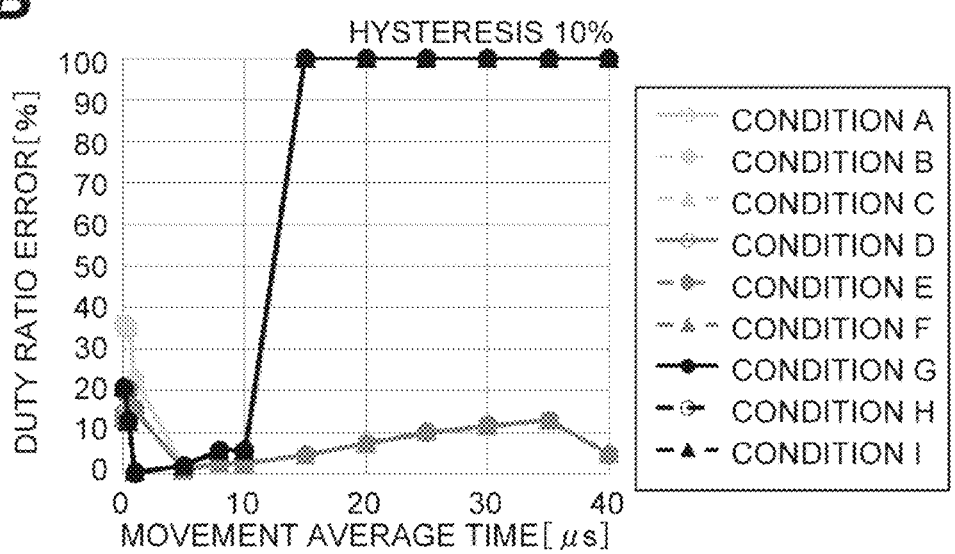
Figure 18C:
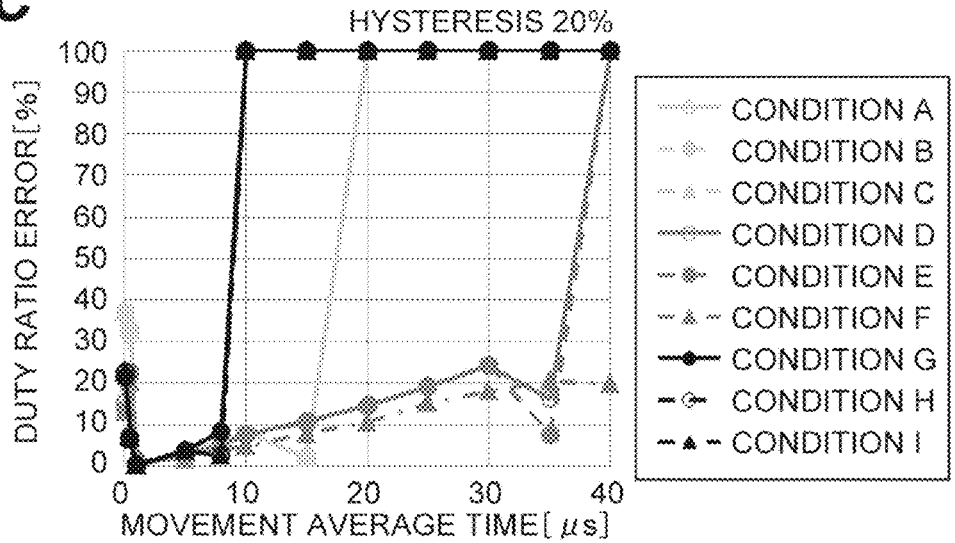

FIGS. 18A to 18C are graphs illustrating results of simulating a relationship between a movement average time and a duty ratio error every hysteresis ratio (0% to 20%). A transverse axis expresses a movement average time, and a longitudinal axis expresses a duty ratio. A graph in FIG. 18A illustrates a relationship between a movement average time and a duty ratio error at a hysteresis ratio of 0% under the conditions A to I. In the conditions A to I, it is checked that a duty ratio error is reduced in a range of a movement average time of 0.1 to 5 μs. A graph in FIG. 18B illustrates a relationship between a movement average time and a duty ratio error at a hysteresis ratio of 10% under the conditions A to I. In the conditions A to I, it is checked that a duty ratio error is reduced in a range of a movement average time of 0.1 to 5 μs. A graph in FIG. 18C illustrates a relationship between a movement average time and a duty ratio error at a hysteresis ratio of 20% under the conditions A to I. In the conditions A to I, it is checked that a duty ratio error is reduced in a range of a movement average time of 0.1 to 5 μs.

Figure 19A:
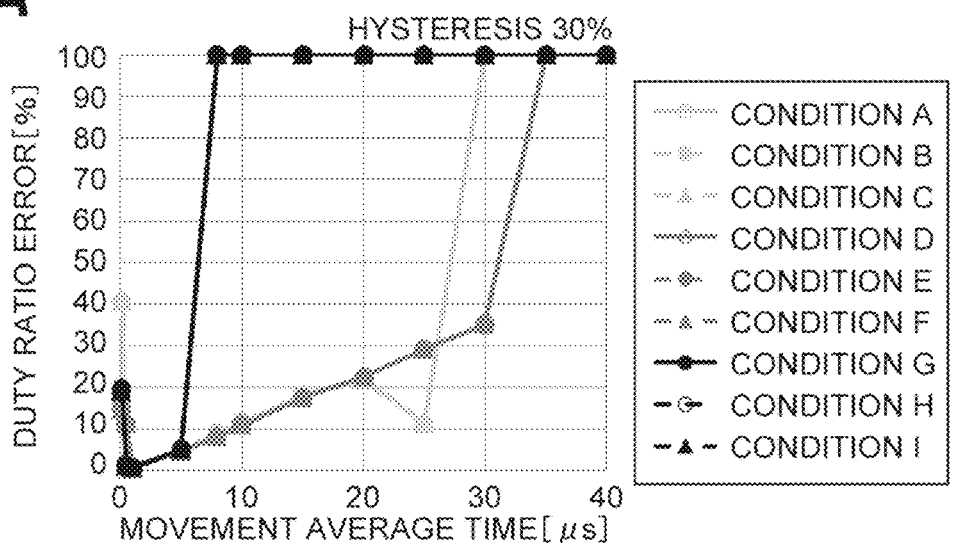
FIGS. 19A to 19C are graphs illustrating results of simulating a relationship between a movement average time and a duty ratio error every hysteresis ratio (30% to 50%).
Figure 19B:
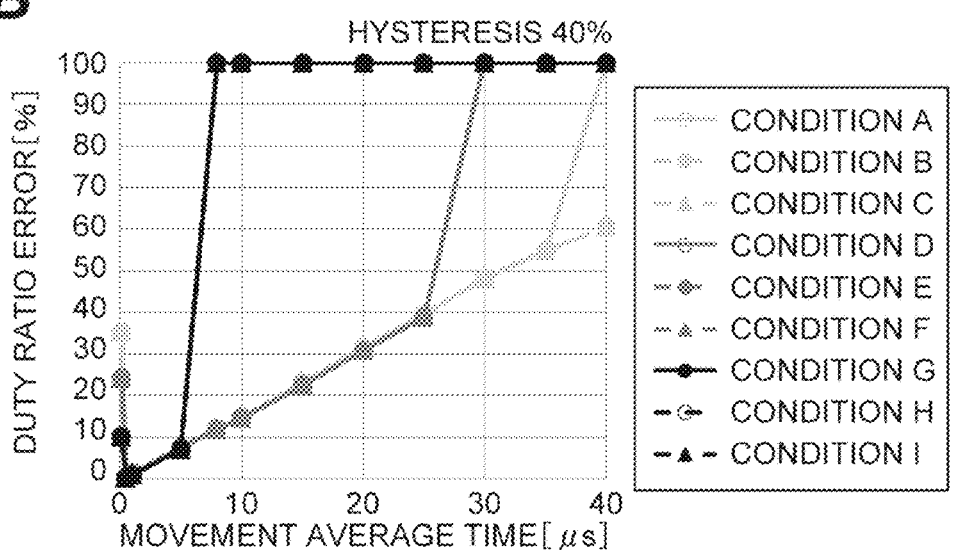
Figure 19C:
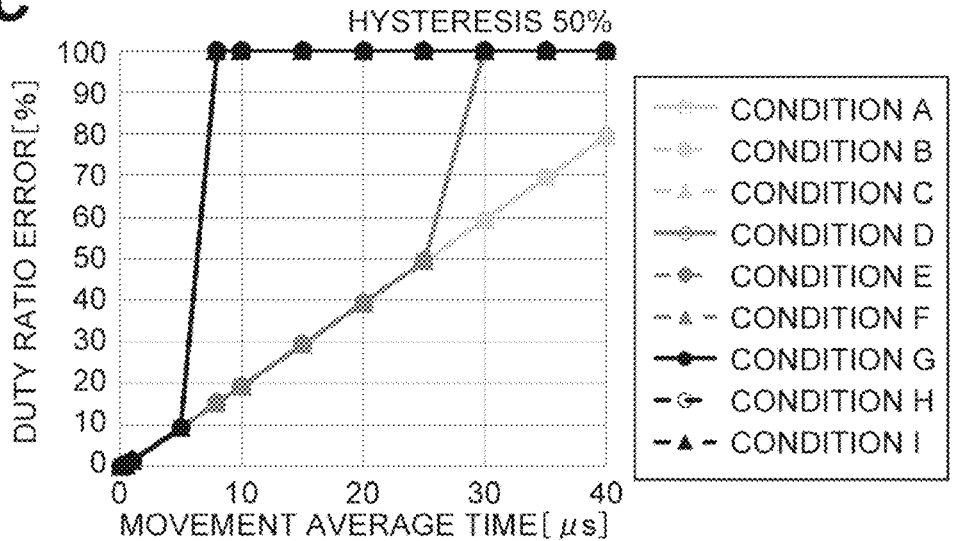

FIGS. 19A to 19C are graphs illustrating results of simulating a relationship between a movement average time and a duty ratio error every hysteresis ratio (30% to 50%). A transverse axis expresses a movement average time, and a longitudinal axis expresses a duty ratio error. A graph in FIG. 19A illustrates a relationship between a movement average time and a duty ratio error at a hysteresis ratio of 30% under the conditions A to I. In the conditions A to I, it is checked that a duty ratio error is reduced in a range of a movement average time of 0.1 to 5 μs. A graph in FIG. 19B illustrates a relationship between a movement average time and a duty ratio error at a hysteresis ratio of 40% under the conditions A to I. In the conditions A to I, it is checked that a duty ratio error is reduced in a range of a movement average time of 0.1 to 5 μs. A graph in FIG. 19C illustrates a relationship between a movement average time and a duty ratio error at a hysteresis ratio of 50% under the conditions A to I. In the conditions A to I, it is checked that a duty ratio error is reduced in a range of a movement average time of 0.1 to 5 μs.

FIGS. 16A to 19C illustrate simulation results at a setting pulse frequency of 20 kHz. Similar simulation was performed at setting pulse frequencies of 1 kHz, 10 kHz, 40 kHz, and 50 kHz. Simulation results were converted to obtain contour diagrams in which a transverse axis expresses a movement average time, a longitudinal axis expresses a hysteresis ratio, and the maximum error is a parameter. Results thereof are illustrated in FIGS. 20A to 22C.

FIGS. 20A to 20F are graphs illustrating results of simulating a relationship among a hysteresis ratio, a movement average time, and the maximum error every pulse frequency (1 kHz and 10 kHz). In graphs in FIGS. 20A and 20B, a setting pulse frequency is 1 kHz. FIG. 20A is contour diagram in which a transverse axis expresses a movement average time, a longitudinal axis expresses a hysteresis ratio, and the maximum error is a parameter. FIG. 20B is contour diagram in which a transverse axis expresses a movement average time, a longitudinal axis expresses a hysteresis ratio, and frequency accuracy is a parameter. FIG. 20C is contour diagram in which a transverse axis expresses a movement average time, a longitudinal axis expresses a hysteresis ratio, and a duty ratio error is a parameter. The graph in FIG. 20A is derived by taking the maximum in the graphs in of FIGS. 20B and 20C. At the pulse frequency of 1 kHz, it can be seen that a hysteresis ratio and a movement average time are set such that a color of the graph in FIG. 20A is darkened, and thus the maximum error can be made at least 5% or less.

In graphs in FIGS. 20D to 20F, a setting pulse frequency is 10 kHz. FIG. 20D is contour diagram in which a transverse axis expresses a movement average time, a longitudinal axis expresses a hysteresis ratio, and the maximum error is a parameter. FIG. 20E is contour diagram in which a transverse axis expresses a movement average time, a longitudinal axis expresses a hysteresis ratio, and frequency accuracy is a parameter. FIG. 20F is contour diagram in which a transverse axis expresses a movement average time, a longitudinal axis expresses a hysteresis ratio, and a duty ratio error is a parameter. The graph in FIG. 20D is derived by taking the maximum in the graphs in FIGS. 20E and 20F. At the pulse frequency of 10 kHz, it can be seen that a hysteresis ratio and a movement average time are set such that a color of the graph in FIG. 20D is darkened, and thus the maximum error can be made at least 5% or less.

Figures 21A, 21B, 21C, 21D, 21E, 21F:
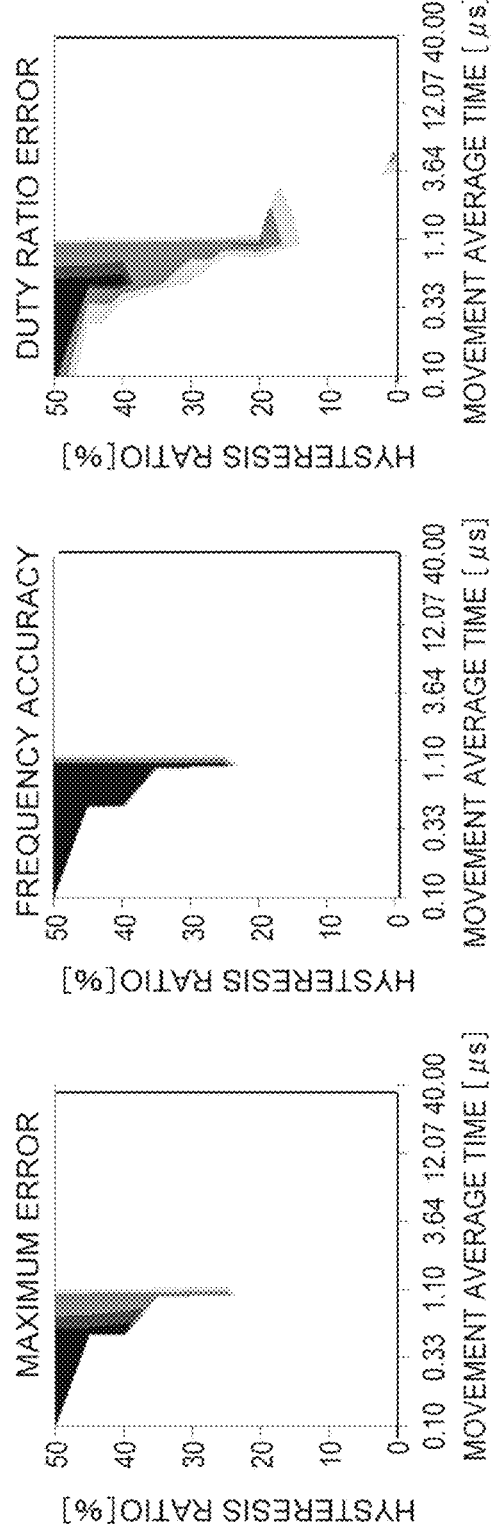
FIGS. 21A to 21F are graphs illustrating results of simulating a relationship among a hysteresis ratio, a movement average time, and the maximum error every pulse frequency (20 kHz and 40 kHz).

FIGS. 21A to 21F are graphs illustrating results of simulating a relationship among a hysteresis ratio, a movement average time, and the maximum error every pulse frequency (20 kHz and 40 kHz). In graphs in of FIGS. 21A to 21C, a setting pulse frequency is 20 kHz. FIG. 21A is contour diagram in which a transverse axis expresses a movement average time, a longitudinal axis expresses a hysteresis ratio, and the maximum error is a parameter. FIG. 21B is contour diagram in which a transverse axis expresses a movement average time, a longitudinal axis expresses a hysteresis ratio, and frequency accuracy is a parameter. FIG. 21C is contour diagram in which a transverse axis expresses a movement average time, a longitudinal axis expresses a hysteresis ratio, and a duty ratio error is a parameter. The graph in FIG. 21A is derived by taking the maximum in the graphs in FIGS. 21B and 21C. At the pulse frequency of 20 kHz, it can be seen that a hysteresis ratio and a movement average time are set such that a color of the graph in FIG. 21A is darkened, and thus the maximum error can be made at least 5% or less.

In graphs in FIGS. 21D to 21F, a setting pulse frequency is 40 kHz. FIG. 21D is contour diagram in which a transverse axis expresses a movement average time, a longitudinal axis expresses a hysteresis ratio, and the maximum error is a parameter. FIG. 21E is contour diagram in which a transverse axis expresses a movement average time, a longitudinal axis expresses a hysteresis ratio, and frequency accuracy is a parameter. FIG. 21F is contour diagram in which a longitudinal axis expresses a movement average time, a transverse axis expresses a hysteresis ratio, and a duty ratio error is a parameter. The graph in FIG. 21D is derived by taking the maximum in the graphs in FIGS. 21E and 21F. At the pulse frequency of 40 kHz, it can be seen that a hysteresis ratio and a movement average time are set such that a color of the graph in FIG. 21D is darkened, and thus the maximum error can be made at least 5% or less.

FIGS. 22A to 22C are graphs illustrating results of simulating a relationship among a hysteresis ratio, a movement average time, and the maximum error at a frequency (50 kHz). FIG. 22A is contour diagram in which a transverse axis expresses a movement average time, a longitudinal axis expresses a hysteresis ratio, and the maximum error is a parameter. FIG. 22B is contour diagram in which a transverse axis expresses a movement average time, a longitudinal axis expresses a hysteresis ratio, and frequency accuracy is a parameter. FIG. 22C is contour diagram in which a transverse axis expresses a movement average time, a longitudinal axis expresses a hysteresis ratio, and a duty ratio error is a parameter. The graph in FIG. 22A is derived by taking the maximum in the graphs in FIGS. 22B and 22C. At the pulse frequency of 50 kHz, it can be seen that a hysteresis ratio and a movement average time are set such that a color of the graph in FIG. 22A is darkened, and thus the maximum error can be made at least 5% or less.

The graphs in of FIGS. 20A and 20D, the graphs in of 21A and 21D, and the graph in FIG. 22A overlap each other, and thus it is possible to derive a combination of a movement average time and a hysteresis ratio in which the maximum error is reduced in ranges of the setting pulse frequency of 1 kHz to 50 kHz, the setting duty ratio of 10% to 90%, and the setting power of 500 W to 2500 W. A result thereof is illustrated in FIG. 23.

Figure 23:
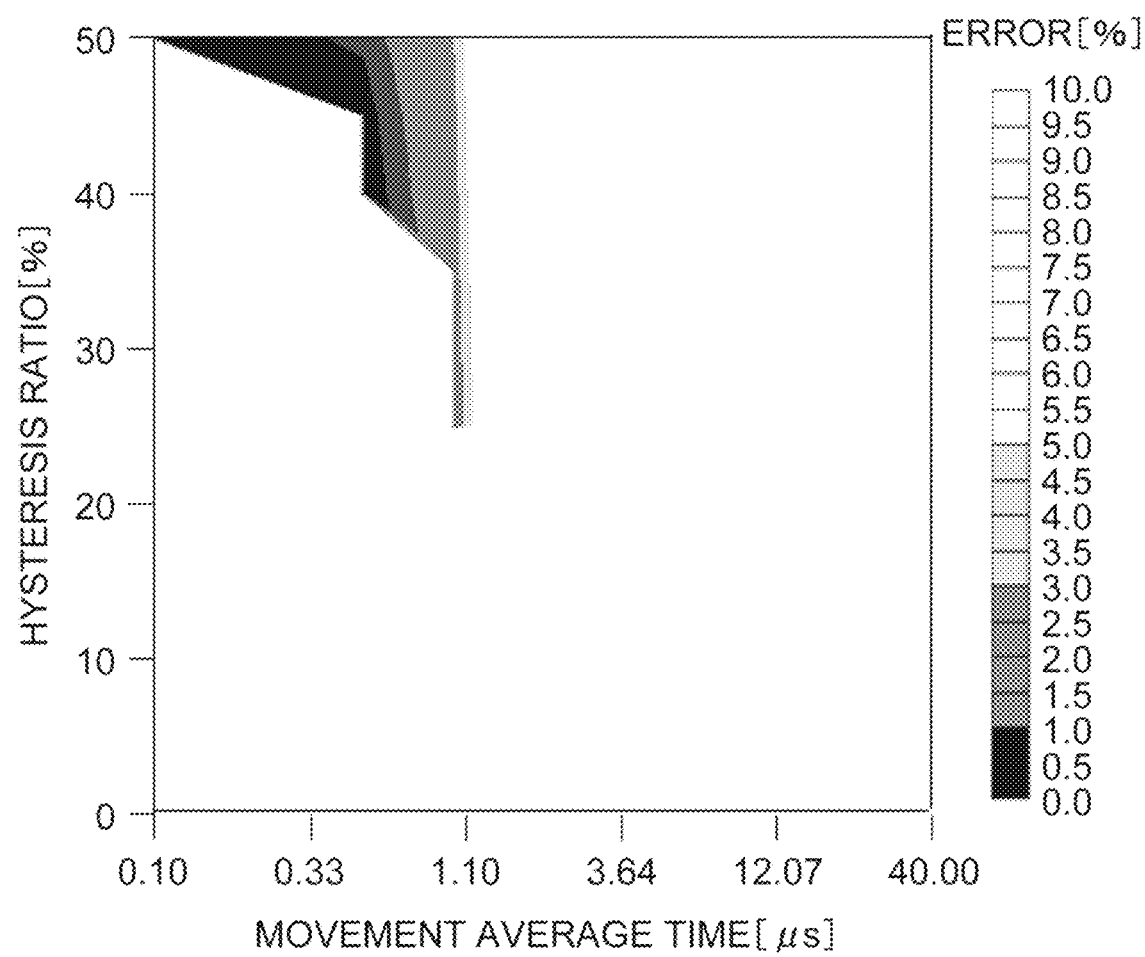
FIG. 23 illustrates a simulation result indicating a relationship between a hysteresis ratio and a movement average time.

FIG. 23 illustrates a simulation result indicating a relationship between a hysteresis ratio and a movement average time. FIG. 23 is contour diagram in which a transverse axis expresses a movement average time, a longitudinal axis expresses a hysteresis ratio, and the maximum error is a parameter. It can be seen that a hysteresis ratio and a movement average time are set such that a color of the graph in FIG. 23 is darkened, and thus the maximum error can be made at least 5% or less in the ranges of the setting pulse frequency of 1 kHz to 50 kHz, the setting duty ratio of 10% to 90%, and the setting power of 500 W to 2500 W.

FIGS. 24A and 24B are partially enlarged view of FIG. 23, and are graphs illustrating the first region and the second region in a simulation result indicating a relationship between a hysteresis ratio and a movement average time. FIGS. 24A and 24B are contour diagrams in which a transverse axis expresses a movement average time, a longitudinal axis expresses the hysteresis ratio Hys, and the maximum error is a parameter. A graph in FIG. 24A illustrates the first region R1 in which the maximum error is 1% or less. Specifically, the first region R1 is a closed region obtained by connecting, with line segments, the first point P1 at which the hysteresis ratio is 50% and the movement average time is 0.1 µs, the second point P2 at which the hysteresis ratio is 45% and the movement average time is 0.5 µs, the third point P3 at which the hysteresis ratio is 40% and the movement average time is 0.5 is, the fourth point P4 at which the hysteresis ratio is 37% and the movement average time is 0.75 µs, and the fifth point P5 at which the hysteresis ratio is 50% and the movement average time is 0.6 µs to each other in an order of the first point P1, the second point P2, the third point P3, the fourth point P4, and the fifth point P5, and the first point P1. A graph in FIG. 24B illustrates the second region R2 in which the maximum error is 3% or less. The second region R2 is a closed region obtained by connecting, with line segments, the first point P1 at which the hysteresis ratio is 50% and the movement average time is 0.1 µs, the second point P2 at which the hysteresis ratio is 45% and the movement average time is 0.5 µs, the third point P3 at which the hysteresis ratio is 40% and the movement average time is 0.5 µs, the sixth point P6 at which the hysteresis ratio is 35% and the movement average time is 1.0 µs, and the seventh point P7 at which the hysteresis ratio is 50% and the movement average time is 1.0 µs to each other in an order of the first point P1, the second point P2, the third point P3, the sixth point P6, and the seventh point P7, and the first point P1.

As mentioned above, according to the simulation results, a combination of a movement average time and a hysteresis ratio in which the modification example is 1% or less or 3% or less is obtained.

What is claimed is:

1. A pulse monitor device configured to monitor a pulse frequency and a duty ratio of a microwave generated by a microwave output device provided in a plasma processing apparatus including a wave guide tube, the pulse monitor device comprising:
a wave detection unit configured to detect a measured value corresponding to travelling wave power of a microwave in the wave guide tube; and
an acquisition unit configured to acquire a frequency and a duty ratio of the travelling wave power on the basis of the measured value detected by the wave detection unit,
wherein the plasma processing apparatus includes
a chamber main body,
the microwave output device configured to generate a microwave having a center frequency and a bandwidth respectively corresponding to a setting frequency and a setting bandwidth for which instructions are given from a controller and of which power is pulse-modulated such that a pulse frequency, a duty ratio, a high level, and a low level respectively corresponding to a setting pulse frequency, a setting duty ratio, high level setting power, and low level setting power for which instructions are given from the controller are obtained,
the wave guide tube connected between the microwave output device and the chamber main body, and
a tuner provided in the wave guide tube.

2. The pulse monitor device according to claim 1,
wherein, in a case where hysteresis threshold values for determining a high level and a low level of travelling wave power of a microwave detected by the wave detection unit are defined according to Equation (1), the acquisition unit acquires a frequency and a duty ratio of the travelling wave power of the microwave by using a hysteresis ratio and a movement average time included in a first region on a coordinate plane in which a longitudinal axis expresses a hysteresis ratio, and a transverse axis expresses a movement average time, and wherein the first region is a closed region obtained by connecting, with line segments, a first point at which the hysteresis ratio is 50% and the movement average time is 0.1 µs, a second point at which the hysteresis ratio is 45% and the movement average time is 0.5 µs, a third point at which the hysteresis ratio is 40% and the movement average time is 0.5 µs, a fourth point at which the hysteresis ratio is 37% and the movement average time is 0.75 µs, and a fifth point at which the hysteresis ratio is 50% and the movement average time is 0.6 µs to each other in an order of the first point, the second point, the third point, the fourth point, and the fifth point, and the first point $$\begin{cases} HysH = \frac{Pset}{2} + Pset \cdot Hys \cdot \frac{1}{100} \\ HysL = \frac{Pset}{2} - Pset \cdot Hys \cdot \frac{1}{100} \end{cases} \quad (1)$$

where, HysH indicates a threshold value for determining a high level of travelling wave power of a microwave, HysL indicates a threshold value for determining a low level of travelling wave power of a microwave, Pset indicates high level setting power, and Hys indicates the hysteresis ratio and is 0% or more and 50% or less.

3. The pulse monitor device according to claim 1,
wherein, in a case where hysteresis threshold values for determining a high level and a low level of travelling wave power of a microwave detected by the wave detection unit are defined according to Equation (1), the acquisition unit acquires a frequency and a duty ratio of the travelling wave power of the microwave by using a hysteresis ratio and a movement average time included in a second region on a coordinate plane in which a longitudinal axis expresses a hysteresis ratio, and a transverse axis expresses a movement average time, and wherein the second region is a closed region obtained by connecting, with line segments, a first point at which the hysteresis ratio is 50% and the movement average time is 0.1 μs, a second point at which the hysteresis ratio is 45% and the movement average time is 0.5 μs, a third point at which the hysteresis ratio is 40% and the movement average time is 0.5 μs, a sixth point at which the hysteresis ratio is 35% and the movement average time is 1.0 μs, and a seventh point at which the hysteresis ratio is 50% and the movement average time is 1.0 s to each other in an order of the first point, the second point, the third point, the sixth point, and the seventh point, and the first point $$\begin{cases} HysH = \dfrac{Pset}{2} + Pset \cdot Hys \cdot \dfrac{1}{100} \\ HysL = \dfrac{Pset}{2} - Pset \cdot Hys \cdot \dfrac{1}{100} \end{cases} \quad (1)$$

where, HysH indicates a threshold value for determining a high level of travelling wave power of a microwave, HysL indicates a threshold value for determining a low level of travelling wave power of a microwave, Pset indicates high level setting power, and Hys indicates the hysteresis ratio and is 0% or more and 50% or less.

4. The pulse monitor device according to claim 1, wherein the low level setting power is 0 W or more and 400 W or less.

5. The pulse monitor device according to claim 2, wherein the low level setting power is 0 W or more and 400 W or less.

6. The pulse monitor device according to claim 3, wherein the low level setting power is 0 W or more and 400 W or less.

7. The pulse monitor device according to claim 1, wherein the wave detection unit detects a measured value corresponding to travelling wave power of a microwave in a wave guide tube between the microwave output device and the tuner.

8. The pulse monitor device according to claim 2, wherein the wave detection unit detects a measured value corresponding to travelling wave power of a microwave in a wave guide tube between the microwave output device and the tuner.

9. The pulse monitor device according to claim 3, wherein the wave detection unit detects a measured value corresponding to travelling wave power of a microwave in a wave guide tube between the microwave output device and the tuner.

10. The pulse monitor device according to claim 4, wherein the wave detection unit detects a measured value corresponding to travelling wave power of a microwave in a wave guide tube between the microwave output device and the tuner.

11. The pulse monitor device according to claim 1, wherein the wave detection unit detects a measured value corresponding to travelling wave power of a microwave on the basis of a wave detection signal in the tuner.

12. The pulse monitor device according to claim 2, wherein the wave detection unit detects a measured value corresponding to travelling wave power of a microwave on the basis of a wave detection signal in the tuner.

13. The pulse monitor device according to claim 3, wherein the wave detection unit detects a measured value corresponding to travelling wave power of a microwave on the basis of a wave detection signal in the tuner.

14. The pulse monitor device according to claim 4, wherein the wave detection unit detects a measured value corresponding to travelling wave power of a microwave on the basis of a wave detection signal in the tuner.

15. The pulse monitor device according to claim 1, wherein the wave detection unit detects a measured value corresponding to travelling wave power of a microwave in a wave guide tube between the tuner and the chamber main body.

16. The pulse monitor device according to claim 2, wherein the wave detection unit detects a measured value corresponding to travelling wave power of a microwave in a wave guide tube between the tuner and the chamber main body.

17. The pulse monitor device according to claim 3, wherein the wave detection unit detects a measured value corresponding to travelling wave power of a microwave in a wave guide tube between the tuner and the chamber main body.

18. The pulse monitor device according to claim 4, wherein the wave detection unit detects a measured value corresponding to travelling wave power of a microwave in a wave guide tube between the tuner and the chamber main body.

19. The pulse monitor device according to claim 1, further comprising:
a warning unit configured to compare a pulse frequency or a duty ratio measured by the wave detection unit with a predetermined threshold value, and outputs a warning on the basis of a comparison result.

20. A plasma processing apparatus comprising:
a chamber main body;
a microwave output device configured to generate a microwave having a center frequency and a bandwidth respectively corresponding to a setting frequency and a setting bandwidth for which instructions are given from a controller and of which power is pulse-modulated such that a pulse frequency, a duty ratio, a high level, and a low level respectively corresponding to a setting pulse frequency, a setting duty ratio, high level setting power, and low level setting power for which instructions are given from the controller are obtained;
a wave guide tube connected between the microwave output device and the chamber main body;
a tuner provided in the wave guide tube; and
a pulse monitor device configured to monitor a pulse frequency and a duty ratio of a microwave generated by the microwave output device,
wherein the pulse monitor device includes
a wave detection unit configured to detect a measured value corresponding to travelling wave power of a microwave in the wave guide tube, and
an acquisition unit configured to acquire a frequency and a duty ratio of the travelling wave power on the basis of the measured value detected by the wave detection unit.

* * * * *